United States Patent [19]
Suzuki et al.

[11] Patent Number: 5,929,553
[45] Date of Patent: Jul. 27, 1999

[54] PIEZOELECTRIC TRANSFORMER

[75] Inventors: Hiromi Suzuki; Mitsuhiro Sugimoto; Yuko Sato; Naoto Taihaku, all of Tokyo, Japan

[73] Assignee: NEC Corporation, Tokyo, Japan

[21] Appl. No.: 08/827,063

[22] Filed: Mar. 26, 1997

[30] Foreign Application Priority Data

Mar. 26, 1996 [JP] Japan .................................. 8-070243

[51] Int. Cl.⁶ .................................................. H01L 41/08
[52] U.S. Cl. ............................................ 310/355; 310/348
[58] Field of Search ................................... 310/352, 348, 310/365, 366, 354, 355, 356

[56] References Cited

U.S. PATENT DOCUMENTS

| 5,329,682 | 7/1994 | Thurn et al. ............................ 29/25.35 |
| 5,616,981 | 4/1997 | Nagano et al. ........................... 310/326 |
| 5,747,916 | 5/1998 | Sugimoto et al. ....................... 310/348 |

FOREIGN PATENT DOCUMENTS

| 55-124873 | 2/1954 | Japan . |
| 60-55117 | 4/1985 | Japan . |
| 61-18208 | 1/1986 | Japan . |
| 61-18209 | 1/1986 | Japan . |
| 63-40018 | 3/1988 | Japan . |
| 63-40019 | 3/1988 | Japan . |
| 63-136425 | 9/1988 | Japan . |
| 2-110811 | 4/1990 | Japan . |
| 4-35514 | 2/1992 | Japan . |
| 4-67814 | 6/1992 | Japan . |
| 4-85823 | 7/1992 | Japan . |
| 4-85824 | 7/1992 | Japan . |

*Primary Examiner*—Mark O. Budd
*Attorney, Agent, or Firm*—Young & Thompson

[57] ABSTRACT

A piezoelectric transformer having a structure where an electrode on a side of a transformer element and a lead terminal made of a leaf spring on a side of a package are brought into pressural contact with each other by an elastic spring performance of the lead terminal. An angle of inclination is given to a terminal portion of the lead terminal in respect of a base portion, whereby the terminal portion of the lead terminal is opened in a direction of extending the base portion, when the base portion is bent, with a side wall of a case being a fulcrum for the bending, by receiving a static pressing force from a transformer element on the terminal portion. An angle of rotation caused at the terminal portion by bending the base portion is counteracted by this angle of inclination, by which the terminal portion and the electrode of the transformer element are always kept in parallel with each other.

6 Claims, 15 Drawing Sheets

PIEZOELECTRIC TRANSFORMER

BACKGROUND OF THE INVENTION

1. Field of the Invention

The present invention relates to a piezoelectric transformer used in an inverter circuit for a back light of a cold cathode tube in a liquid crystal display panel for personal computers or car navigation systems, an adapter power source circuit used generally in electronic instruments for civil use, an electronic copier or the like, particularly to a structure thereof for mounting to a package.

2. Description of Related Art

In recent years development of a piezoelectric transformer using a piezoelectric effect has actively been performed as a voltage conversion element for generating high voltage used in a power source voltage in a device which needs high voltage, such as a back light inverter or a deflector in a television set. Compared with a conventionally used wiring type electromagnetic transformer, a piezoelectric transformer has numerous advantages such that downsizing and thinning thereof is facilitated, noninflammability thereof can be achieved since the piezoelectric transformer uses ceramics for its material, a noise caused by electromagnetic induction is not emitted, or the like.

With development of such a piezoelectric transformer, a highly reliable package for encapsulating a piezoelectric transformer is requested. A piezoelectric transformer generally comprises a drive unit and a power generating unit and is of a constitution where a total of the transformer is vibrated when an a.c. voltage is applied to the drive unit by which high voltage is generated in the generating unit (a case of step-up type transformer). Hence, a method of supporting such an oscillator becomes important in view of mounting the oscillator. Many reports have been issued in respect of methods of supporting such a kind of piezoelectric body in relation to a package structure concerning a piezoelectric resonator.

According to one of conventionally-known methods of supporting a piezoelectric body, there has been provided a method of forming projections to supporters. One example of such a method of supporting a piezoelectric body is disclosed in Japanese Unexamined Utility Model Publication No. JU-A-63-40018 (hereinafter, a first publication). FIG. 11(a) is a sectional view of a piezoelectric part disclosed in the first publication. FIG. 11(b) is a perspective view showing a support terminal in FIG. 11(a). Referring to FIG. 11(a), a piezoelectric element 1A is pinched by two support terminals 1013 and 1014 in a case 1012. A spherical protrusion 1013a as illustrated by FIG. 11(b) is formed in the support terminal 1013. Similarly, a protrusion 1014a is formed on the other support terminal 1014 at a position opposed to the projection 1013a. This piezoelectric part has a structure where the opposed projections 1013a and 1014a are brought into contact with the piezoelectric element 1A thereby supporting the piezoelectric element 1A.

However, according to the method of supporting the piezoelectric element described above, when it is applied to supporting, for example, a piezoelectric transformer, instantaneous disconnection may be caused at an electric terminal since the supporting bodies cannot follow the piezoelectric element when an impact is applied. It is conceivable as a means for solving such a problem to provide elastic spring performance to the supporter. The method of forming a bent portion in a supporter has been disclosed to realize such a structure.

An example of such a method is disclosed in Japanese Unexamined Utility Model Publication No. JU-A-4-85823 (hereinafter, referred to as a second publication). FIG. 12(a) is a sectional view of a piezoelectric resonance part according to the second publication. FIG. 12(b) is a front view showing a spring terminal in FIG. 12(a). Referring to FIG. 12(a), a piezoelectric element 1B in a flat plate shape is pinched by a projection 1023a of a spring terminal 1023 and a projection 1024a of a support terminal 1024 opposed to the spring terminal 1023, both of which are brought into contact with the piezoelectric element 1B. Specifically, the spring terminal 1023 has a structure where ridge-like spring portions 1023s are formed around the central portion of the terminal and the projection 1023a is formed at the central apex of the spring portions 1023s as shown by FIG. 12(b). Therefore, accordingly, a piezoelectric element 1B is supported by being pressed by the elastic spring performance of the spring terminal 1023 constituted as described above.

There have been other reports of examples where the elastic spring performance is provided by forming a bent portion in a supporter as in the spring portions 1023s in a ridge-like shape of the second publication. Technologies disclosed in Japanese Unexamined Utility Model No. JU-A-60-55117 (hereinafter, referred to as a third publication) or Japanese Unexamined Patent Publication No. JP-A-61-18209 (hereafter, referred to as a fourth publication) show examples of such a supporting method.

FIG. 13(a) is a sectional view showing a structure for holding a piezoelectric element according to the third publication. FIG. 13(b) illustrates a side view and a top view of a bent portion of a support terminal in FIG. 13(a). Referring to FIG. 13(a), a piezoelectric element 1C in a flat plate shape is pinched by a support element 1033 and a support element 1034 in a case 1032. A conductive elastic body 1035 is interposed between the support element 1034 and the piezoelectric element 1C. According to the support terminal 1034, a bent portion 1034a is formed at a portion thereof opposed to the elastic body 1035 whereby the spring elastic performance is provided and the piezoelectric element 1C is pressed and supported by the bent portion 1034a and the elastic body 1035. Incidentally, in respect of the bent portion 1034a, as illustrated by FIG. 13(b), the height is 1.5 through 3.0 times as large as the thickness T of the terminal and the width is 0.8 through 20.0 times as large as the width of the terminal.

A ceramic resonator according to the fourth publication is shown in FIGS. 14(a) and 14(b). FIG. 14(a) is a perspective view of a package and FIG. 14(b) is a sectional view of a mounted ceramic resonator. As shown by FIG. 14(a), a metal support plate 1043 is embedded in a case 1042. The support plate 1043 is constituted by two cut-off portions 1043b formed around the central portion and a spring-like portion 1043a formed by pushing out the cut-off portion. FIG. 14(b) shows the structure of the ceramic resonator encapsulating a piezoelectric element 1D by using two of the cases constituted as described above. As shown by FIG. 14(b), the piezoelectric element 1D is pressed and supported by the two spring-like portions 1043a and 1044a. There is other ceramic resonator using a similar supporting method disclosed in Japanese Unexamined Patent Publication No. JP-A-61-18208. According to the publication, a piezoelectric element is supported by support plates each formed by embedding an elastic material at a back face of a projection in contact with the piezoelectric element.

As examples for providing the elastic spring performance to supporters as disclosed in the above-described second through fourth publications, there have been known technologies of partially cutting and raising supporters. As examples of such supporting methods, there are utility models and inventions disclosed in Japanese Unexamined Utility Model No. JU-A-63-40019 (hereinafter, referred to as a fifth publication), Japanese Unexamined Utility Model Publication No. JU-A-63-136425 (hereinafter, referred to as a sixth publication) and Japanese Unexamined Patent Publication No. JP-A-4-35514 (hereinafter, referred to as a seventh publication).

FIG. 15(a) is a perspective view of a supporter used in a piezoelectric oscillation part according to the fifth publication. FIG. 15(b) is a side view showing a state where a piezoelectric element is supported by using the supporter of FIG. 15(a). Referring to FIG. 15(a), a leaf spring 1053 is formed by cutting and raising around the central portion of a supporter 1052. A support projection 1053a for supporting a piezoelectric element 1A by being brought into contact therewith is formed on the side of a front end of the leaf spring 1053. Further, projections 1054a and 1054b are formed in the proximity of the leaf spring 1053. As shown by FIG. 15(b), a piezoelectric element 1E is pressed and pinched by the supporter 1052 and a supporter 1055 where only a support projection 1056 is formed.

FIG. 16(a) is a broken perspective view of an electronic part according to the sixth publication. FIG. 16(b) is an enlarged perspective view of an elastic support piece in FIG. 16(a). Referring to FIG. 16(a), a piezoelectric element 1F is pinched by support terminals 1063 and 1064 in a case 1062. Projections 1063a and 1064a are formed respectively at central portions of the support terminals 1063 and 1064, and these portions are brought into contact with the piezoelectric element 1F. Further, elastic support pieces 1065 having the elastic spring performance which are formed by partially cutting and raising the portions of the support terminal 1064, are formed at the support terminal 1064 and the piezoelectric element 1F is pressed and held by the elastic support pieces 1065 and the support terminal 1063 having the elastic spring performance.

FIG. 17(a) is a sectional view showing the structure of a surface mounting quartz oscillator according to the seventh publication. FIG. 17(b) is a perspective view of a supporter in FIG. 17(a). Referring to FIG. 17(a), a quartz piece 1G in a flat plate shape is pinched by oppositely fixed supporters 1073 and 1074 in a case 1072. In respect of the supporter 1074, as shown by FIG. 17(b), a central portion of a flat plate made of a metal is cut and raised in a section-like shape thereby forming a leaf spring 1074a. The other supporter 1073 has a similar structure. Therefore, the quartz piece 1G is held by being pressed by the elastic spring performance of the supporters 1073 and 1074.

As an example of constituting a supporter by bending it as disclosed in the invention described in the seventh publication, there has been provided a technology disclosed in Japanese Unexamined Utility Model Publication No. JU-A-4-85824 (hereinafter, referred to as an eighth publication) although leaf springs are not used. FIG. 18 is a perspective view of a piezoelectric part described in the publication. Referring to FIG. 18, a piezoelectric substrate 1H in a flat plate shape is pinched by two input/output terminals 1082 front end portions of which are bent in a U-like shape at both end portions of the piezoelectric substrate 1H. A grounding terminal 1083 is arranged at the central portion of the piezoelectric substrate 1H. The front end portion of the grounding terminal 1083 is provided with the structure where the portion is bent and embedded into an outer case, not shown.

Also, there has been other technology disclosed in Japanese Unexamined Patent Publication No. JP-A-2-110811 (hereinafter, referred to as a ninth publication) as an example of utilizing a leaf spring although it is not concerned with a method of supporting a piezoelectric body. FIG. 19(a) is a sectional view showing the structure of a rotating magnetic head drum according to the ninth publication. FIG. 19(b) is a plane view of a grounding brush in FIG. 19(a). Referring to FIG. 19(a), static electricity generated in a rotating drum 1092 is escaped by a grounding brush 1091. As shown by FIG. 19(b), the grounding brush 1091 has a structure where a metal holding piece 1091a and a leaf spring 1091b overlaps each other and an end portion 1091c of the metal holding piece 1091a has a shape where the width is gradually tapered down.

Meanwhile, when the supporting methods of the second through the ninth publications are applied to supporting a transformer element in a piezoelectric transformer, the following problems are caused.

For example, according to each of the second, the fifth, and the sixth publications, only one of the two opposed supporters pinching a piezoelectric element, is provided with the elastic spring performance. The size of a piezoelectric transformer element is larger than those of piezoelectric elements (piezoelectric oscillators) used in the conventional technologies. Therefore, when vibration or impact is applied from a direction on the side of the supporter having no elastic spring performance, the supporter may be separated from the piezoelectric transformer element and instantaneous electric disconnection may be caused.

In contrast thereto, according to each of the third and the fourth publications, both of the two opposed supporters pinching piezoelectric elements, are provided with the elastic spring performance and therefore, the problem of generation of instantaneous electric disconnection is comparatively minor. However, an area thereof in contact with the piezoelectric element is very large, and therefore, when the structure is applied to an element having a large vibrating operation level such as a piezoelectric transformer element, a conversion efficiency between input and output is considerably deteriorated.

According to the method of supporting a quartz vibrator disclosed in the seventh publication, work shapes of parts are complicated, a number of parts is very large and assembling steps are large.

The supporter disclosed in the eighth publication naturally cannot follow vibration or impact from outside as in the first publication. In addition thereto, a total thereof is embedded in an outer case and accordingly, the vibration of the piezoelectric transformer is significantly hampered by which the conversion efficiency between input and output is considerably deteriorated.

Furthermore, according to the leaf spring disclosed in the ninth publication, although resonance is prevented by using two parts of the metal holding piece 1091a and the leaf spring 1091b, in this style, a number of parts must be increased to prevent resonance, which gives rise to an increase in cost.

A piezoelectric transformer encapsulated in a package as shown by FIGS. 20(a) and 20(b) and FIGS. 21(a) and 21(b), has been proposed in consideration of the problems of the conventional piezoelectric resonators, quartz oscillator and the like, which have been described as above. The piezoelectric transformer shown in FIGS. 20(a), 20(b), 21(a) and 21(b) is a piezoelectric transformer described in U.S. application Ser. No. 08/608060 filed by an assignee the same as that of the instant application.

FIG. 20(a) is an exploded perspective view of the piezoelectric transformer. FIG. 21(a) is a sectional view taken from a line A—A of FIG. 20(a). Referring to FIG. 21(a) and FIG. 21(a), a piezoelectric transformer element 1 in an elongated plate shape, is encapsulated in a space surrounded by an upper case 4A and a lower case 4B. A total of three surface electrodes of two input electrodes 52A respectively disposed on both end sides in the longitudinal direction and an output electrode 53A in a stripe shape disposed at the central portion thereof, are independently formed on the upper face of the transformer element 1. A total of the three surface electrodes are formed on the lower face of the transformer element 1 at respective regions opposed to the respective electrodes on the upper face thereof. Upper lead terminals 70A are extended from a side wall of the upper case 4A in the horizontal direction up to the centers of the input electrodes 52A on the upper side of the transformer element 1. A portion of the upper lead terminal 70A in the proximity of the font end thereof is bent in a V-like shape to the side of the transformer element 1 and is brought into contact with the input electrode 52A at a terminal portion 71A. Similarly, lower lead terminals 70B are extended horizontally from a side wall of the lower case 4B up to the central portion of the input electrode 52B on the lower face side of the transformer element 1 and the front end portion is bent and brought into contact with the input electrode 52B at a terminal portion 71B. The upper and lower lead terminals 70A and 70B each formed by working a flat plate starting material made of, for example, phosphor bronze plated with tin, is provided with the elastic spring performance and is embedded in the side wall of the upper and lower cases 4A or 4B to penetrate therethrough from inside to outside by an insert molding process. A portion of the input electrode extended outside of the side wall becomes the portion for connecting to outside. The upper lead element and the lower lead element having such a structure are also provided to the other one of the input electrodes of the transformer element 1. Further, the same are also installed to the output electrodes 53A.

Incidentally, the upper and lower cases 4A and 4B are provided with a snap fit structure one example of which is shown in FIG. 20(b). Therefore, the piezoelectric transformer can be assembled with certainty, simply and with no slack only by fitting together the two upper and lower cases 4A and 4B from top and from bottom.

When such a package is used, instantaneous electric disconnection is not caused between the electrodes on the surfaces of the transformer element 1 and the upper and the lower lead terminals even if impact or vibration is applied from outside since both of the upper and lower lead terminal 70A and 70B pinching the transformer element 1, are provided with the elastic spring performance. Further, as described in U.S. application Ser. No. 08/608060, when an area where the transformer element 1 and the respective upper and lower lead terminals 70A and 70B are brought into contact, is set to 0.5% or less of a projected area of an electrode forming face of the transformer element 1, for each of the terminals, the reduction in the conversion efficiency between input and output becomes substantially nonproblematic. Further, the piezoelectric transformer can be assembled only by mounting and fitting the transformer element 1 to the two upper and lower cases 4A and 4B and therefore, a number of parts and a number of assembling steps are small by which the reduction in cost is facilitated.

According to the piezoelectric transformer (refer to FIG. 20 (a) and FIG. 21(a)) described in the above-mentioned U.S. application Ser. No. 08/608060, initial dispersion and ageing are liable to change the state of contact between the electrodes on the surfaces of the transformer element and the lead terminals. As a result, ① The initial dispersion and the ageing change in the electric conductive state are large and the reliability of conduction must be improved.

② An audible noise in the case where the piezoelectric transformer is encapsulated in a package is liable to cause initially and over time. An explanation will be given thereof as follows.

FIG. 21(b) is a side view showing a state (indicated by the broken lines in the drawing) where no load is applied on the lower lead terminal 70B by the piezoelectric transformer element 1 and a state (indicated by the bold lines in the drawing) where the lower lead element 70B is pushed down by the piezoelectric transformer element 1. When no load is applied on the lead terminal 70B, a terminal portion 71B is in parallel with the electrode forming face of the transformer element 1. Here, when the lead terminal 70B is pushed down by the transformer element 1, a lead terminal root portion 72B is bent with a side wall 5B of a case as a fulcrum as indicated by the bold lines by which a rotational angle is caused at the terminal portion 71B. The rotation is in a direction of rotating the terminal portion 71 B to the right in the drawing. Therefore, the terminal portion 71B is inclined to open toward the direction of extending the lead terminal in respect of the electrode forming face of the transformer element 1. Then, although the electrode on the side of the transformer element and the terminal portion of the lead terminal are originally brought into contact in a face contact, the contact becomes a line contact where the electrode is brought into contact with the piezoelectric element only at an edge line at the bent portion of the terminal portion 71B whereby the contact state becomes very unstable. Moreover, in consideration of mass production performance, the line contact between the electrodes of the transformer element and the terminal portions of the lead terminal, is deteriorated further into a point contact. That is, the lead terminal is fabricated by a method of punching out a starting plate material by a press mold and it is inevitable that burrs are caused at a peripheral portion of the lead terminal in the punching out operation. Further, with respect to a plated lead terminal, in addition to the adverse effect at the peripheral edge of the terminal portion 71B, deposition of plating is further created. That is, with respect to the contact between the electrode of the transformer element and the lead terminal, the contact state is deteriorated from the line contact at the edge line of the bent portion of the lead terminal to two points contact at the both ends of the edge line.

Meanwhile, it is difficult to control the sizes of the burrs or the deposition of plating and therefore, the contact state between the electrode and the lead terminal cannot be controlled even initially in the case of the above-described point contact. That is, only the contact where the dispersion of electric conductive state is very large, can be obtained. Meanwhile, in order to prevent the audible noise due to the lead terminal, the lead terminal is normally designed such that the natural frequencies of the bending mode and the torsion mode do not coincide with the natural frequencies of the bending mode and the torsional mode of the transformer element and the natural frequencies of the lead terminal do not coincide also with the drive frequency of the transformer element. However, in such a lead terminal having such a large dispersion, it is difficult to always satisfy, from the start of fabrication binding conditions of spring designed in such a way, and accordingly, an audible noise is liable to cause.

Further, in the state where the point contact is caused, the contact between the electrode on the side of the transformer element and the lead terminal is not smooth, and accordingly the electrode of the transformer element may be scratched or only a portion of the electrode may be chipped off deeply by the use over a long period of time by vibration or impact from outside. As a result, a noise may be caused by causing instantaneous disconnection due to jumping of the lead terminal, or the audible noise may be going to be emitted gradually during the time of using the lead terminal even if the audible noise is not caused initially. The electric conductive state is naturally deteriorated.

SUMMARY OF THE INVENTION

Accordingly, it is an object of the present invention to provide a piezoelectric transformer which is encapsulated in a package having lead terminals each comprising a leaf spring and is provided with a structure where electrodes on the side of a transformer element and the lead terminals press-contacted to each other by elastic spring performance of the lead terminals, where initial dispersion of contact state between the electrodes on the side of the transformer element and the lead terminals, is small, ageing change of the contact state is small, high reliability of electric conductance is obtained and audible noise is not caused.

According to one aspect of the present invention, there is provided a piezoelectric transformer in which a piezoelectric transformer element is provided with a structure where an input electrode and an output electrode are provided on surfaces of an elongated plate made of a piezoelectric material and an a.c. voltage is applied on the elongated plate from outside via the input electrode whereby the elongated plate is vibrated and a voltage generated by the elongated plate in accordance with the vibration is taken out from the output electrode, the piezoelectric transformer element is encapsulated in a package having a structure where lead terminals each constituted of a conductive leaf spring extending onto the input electrode or the output electrode in parallel with electrode forming faces of the piezoelectric transformer element, are embedded in side walls of a mold case surrounding the piezoelectric transformer element and the lead terminals are press-contacted by an elastic spring performance thereof to nodes of the vibration of the input electrode and the output electrode provided to the piezoelectric transformer element, wherein the lead terminals each is provided with at least a terminal portion including one of portions to be brought into contact with the input electrode or the output electrode of the piezoelectric transformer element, an embedding portion embedded in a side wall of the mold case and a base portion for connecting the terminal portion and the embedding portion and wherein when the terminal portion receives a static pressing force from the piezoelectric transformer element and the base portion is bent with the side wall of the mold case as a fulcrum, a rotational angle caused at the terminal portion is canceled by bending the base portion whereby the terminal portion and the input electrode or the output electrode of the piezoelectric transformer element are kept in parallel with each other.

DETAILED DESCRIPTION OF THE PREFERRED EMBODIMENTS

An explanation will be given of embodiments of the present invention in reference to the drawings as follows.

(Embodiment 1)

Figure 1A:
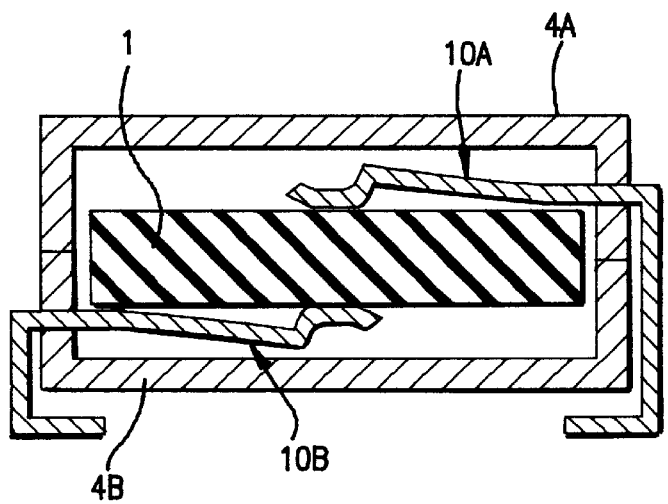
FIGS. 1(*a*), 1(*b*) and 1(*c*) are a sectional view showing a piezoelectric transformer encapsulated in a package according to a first embodiment of the present invention and a side view and a perspective view of a lower lead terminal used therefor.
Figure 1B:
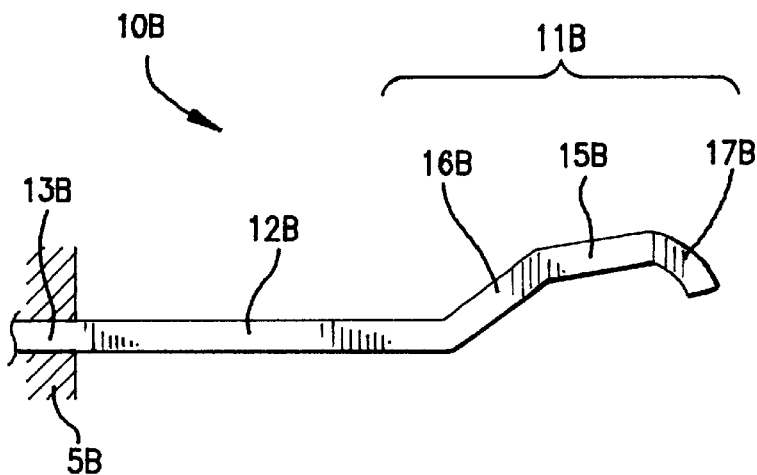
Figure 1C:
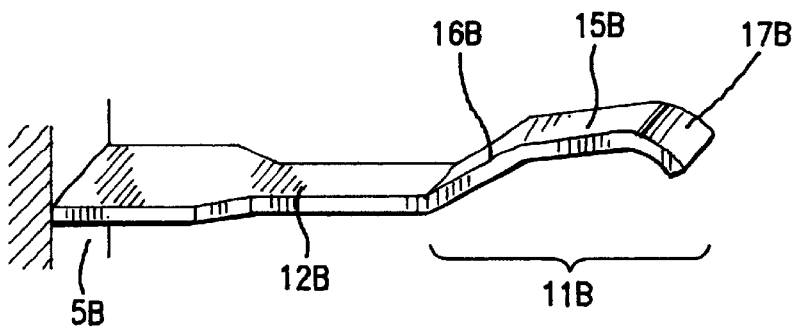
Figure 20A:
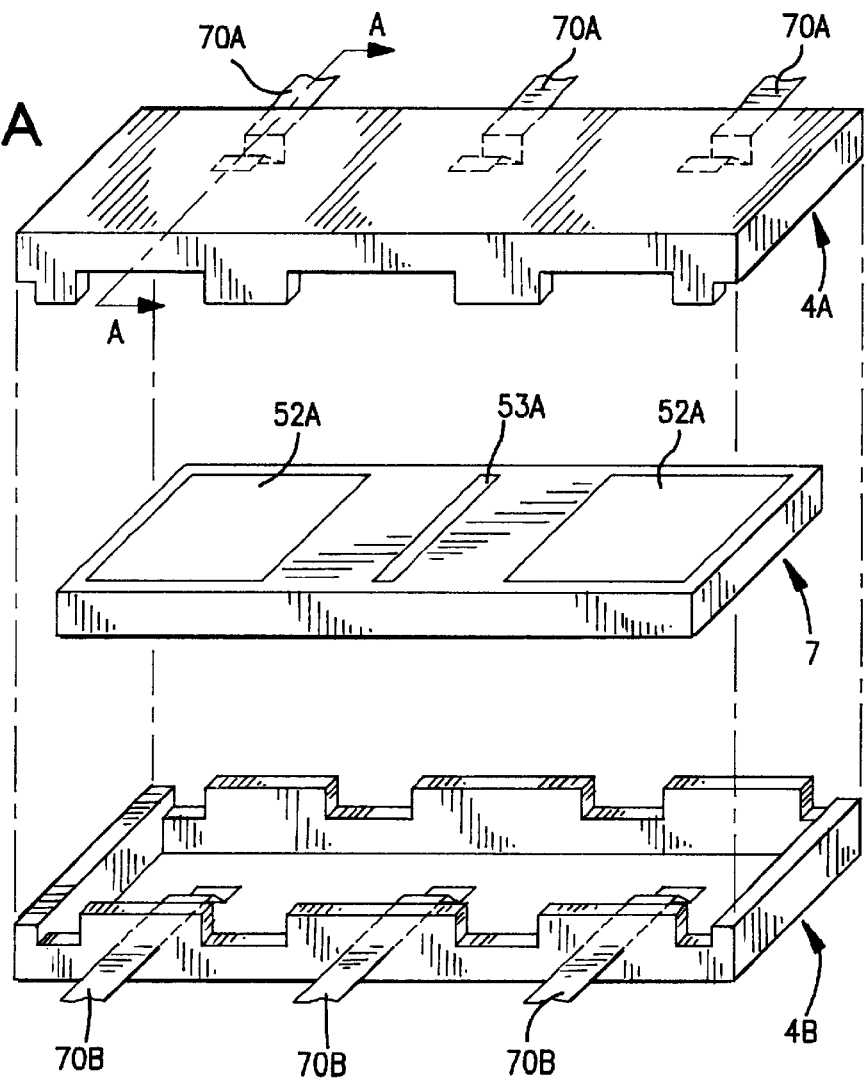
FIGS. 20(a) and 20(b) are respectively an exploded perspective view of a piezoelectric transformer according to U.S. application Ser. No. 08/608060 and a perspective view showing a snap fit structure of a package.
Figure 20B:
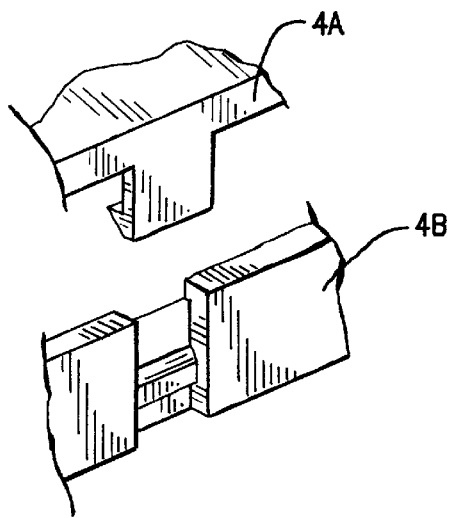

FIG. 1(a) is a sectional view of a piezoelectric transformer encapsulated in a package according to Embodiment 1 of the present invention. FIG. 1(b) and FIG. 1(c) are respectively a side view and a perspective view of a lower lead terminal 10B used in the piezoelectric transformer shown by FIG. 1(a). FIG. 1(b) and FIG. 1(c) respectively show a shape of the lead terminal 10B when no load is applied thereon. Comparing FIG. 1(a) with FIG. 21(a), the side shapes of an upper lead terminal 10A the lower lead terminal 10B are different from those of the conventional piezoelectric transformer. A transformer element 1 and a snap fit structure (refer to FIG. 20(b)) of an upper case 4A and a lower-case 4B are the same as those in the conventional piezoelectric transformer.

An explanation will be given of the structure of the lead terminal used in this embodiment with the lower lead terminal 10B as an example. The upper lead terminal 10A is provided with a structure the same as that of the lower lead terminal 10B so far as portions of them inside of the package are concerned. Incidentally, upper lead terminals and lower lead terminals in embodiments to be mentioned later share the same structure unless particularly specified. Accordingly, an explanation in respect of a lower lead terminal is applicable to the upper lead terminal.

Referring to FIG. 1(b) and FIG. 1(c) showing the side shape of the lower lead terminal 10B, the lead terminal 10B with a cantilever structure where one end of an elongated plate is embedded into a side wall 5B of the mold case is divided into a terminal portion 11B, which is disposed at a front end portion in a direction of extending the elongated plate and is to be brought into contact with a lower electrode of the transformer element 1, and a base portion 12B connecting the terminal portion 11B and a portion 13B embedded into a side wall 5B of the case (embedding portion). The terminal portion 11B is divided into a contact portion 15B that is actually brought into contact with a lower electrode of the transformer element, a connecting portion 16B for connecting the contact portion 15B and the base portion 12B and an edge portion 17B in a curled shape disposed at the end portion of the terminal portion 11B disposed further front side than the contact portion 15B. The characteristic of this embodiment resides in that when no load is applied on the lead terminal 10B, the contact portion 15B is provided with an inclination that is opened toward the direction of extending the lead terminal (direction progressing from the right side to the left side of this paper). According to the conventional piezoelectric transformer, when no load is applied on the lead terminal, three of the base portion and the contact portion of the lead terminal and the transformer element are in parallel with each other (refer to FIG. 21(a)).

Figure 2:
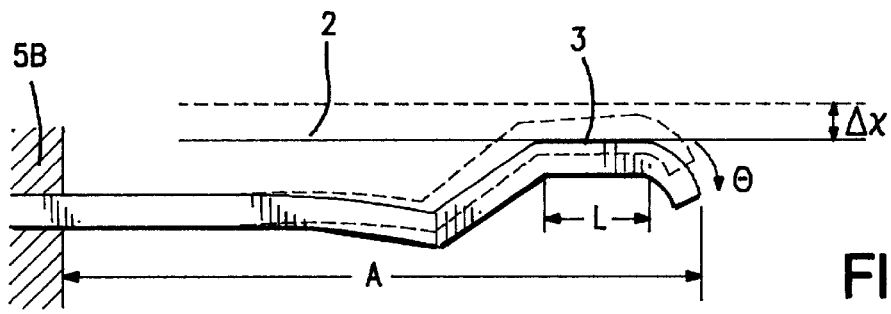
FIG. 2 is a side view schematically showing a state of the lower lead terminal of the piezoelectric transformer encapsulated in the package according to the first embodiment.

FIG. 2 is a side view schematically showing a state of the lower lead terminal when the transformer element is mounted to the inside of the package having the lead terminals illustrated by FIGS. 1(b) and 1(c) whereby the piezoelectric transformer encapsulated in a package is constituted as shown by FIG. 1(a). Referring to FIG. 2, when the transformer element 1 is mounted to the package, the lead terminal 10B receives a static load from an electrode forming face 2 of the transformer element 1 and starts to bend from a state where a force supporting the transformer element 1 is not caused (illustrated by the broken lines in the drawing), in other words, in a state where a deformation amount Δx of elastic deformation of the lead terminal 10B is 0. Further, the lead terminal 10B is rotated with the side wall 5B of the case at the base portion 12B being a fulcrum in for the bending accordance with the elastic deformation (shown by the bold lines in the drawing). At this moment, the contact portion 15B previously inclined to the transformer element 1, is gradually made into parallel with the transformer element 1. Finally, at a stationary state where the lead terminal is pushed down by a predetermined distance, the contact portion 15B parallelly supports the transformer element 1. As a result, the contact portion 15B of the lead terminal and the lower electrode of the transformer element are brought into contact with each other by a face by which an excellent contact is provided. Different from the conventional piezoelectric transformer, a point contact is not caused even if burrs in press drawing operation or deposition of plating are present at a peripheral edge of the lead terminal 10B. Instead, a line contact is caused at the peripheral edge of the contact portion 15B and therefore, the contact state smoother than that in the conventional case is created and local wear of the electrodes of the transformer element or jumping of the lead terminal is significantly improved.

Figure 3A:
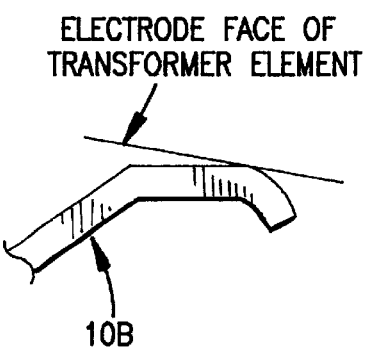
FIGS. 3(*a*), 3(*b*) and 3(*c*) are side views schematically showing a case where a state of supporting the lower lead terminal in respect of the transformer element is extremely deviated.
Figure 3B:
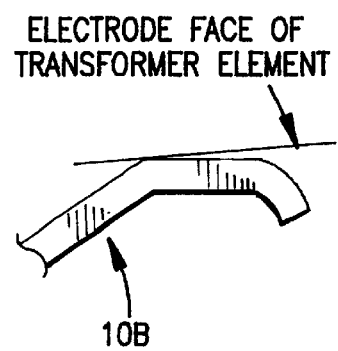
Figure 3C:
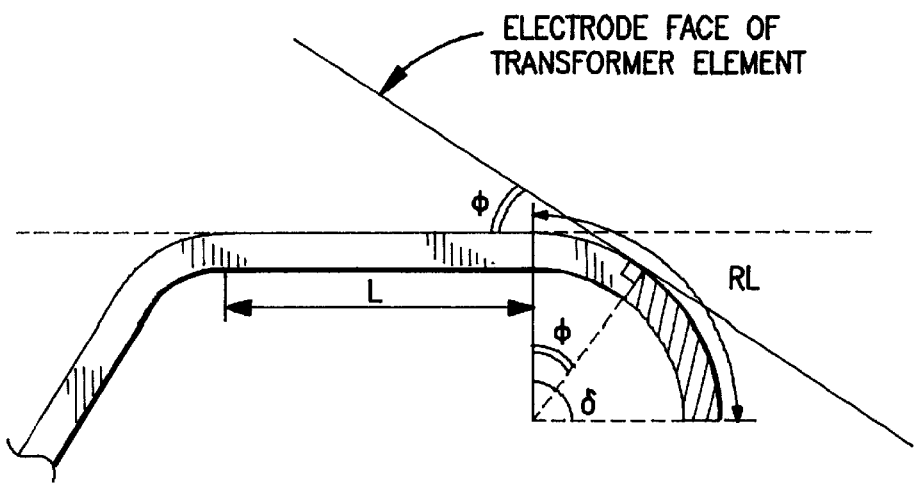

Next, FIGS. 3(a), 3(b) and 3(c) are side views schematically showing a case where the state of supporting the lead terminal 10B in respect of the transformer element 1 is extremely deviated. The illustrated inclinations of the transformer element may be caused by an error in designing to estimate of a bent state, or the ageing change of mold resin or the lead terminal or the like. In order to keep smooth the contact between the electrode of the transformer element and the lead terminal in the piezoelectric transformer, even if the above-described inclination of the transformer element is caused, a point contact in respect of the contact between the electrodes of the transformer element and the lead terminal must be eliminated. For that purpose, according to this embodiment, the edge portion 17B disposed at the end side further front than the contact portion 15B, and a portion thereof connecting the rear end of the contact portion 15B and the connecting portion 16B, are bent in a curled shape by which the shape of these portions are rounded. In respect of a length $R_L$ of the curled portion (for example, edge portion 17B on the front end side), needs to have a length whereby the frontmost end of the curled portion is not brought into contact with the electrode forming face of the transformer element even if the transformer element 1 is inclined to a maximum. Otherwise, the contact between the lead terminal and the electrode of the transformer element becomes a point contact at the frontmost end of the lead terminal. Meanwhile, the contact length must be as short as possible within a range of satisfying the above-described condition. Most of the curled portion is not brought into contact with the electrode of the transformer element but is floated and the curled portion is provided with a value inherent to the curled portion whereby a portion in contact with the electrode of the transformer element becomes a binding face. The vibration of the curled portion having such an inherent value must be restrained to a minimum.

A specific explanation will be given of the piezoelectric transformer encapsulated in the package according to this embodiment. The transformer element has dimensions of width w=10 mm, thickness t=1 mm and length of 42 mm. ZEONITE7130 (trade name; made by Du Pont Corporation) that is a liquid crystal polymer is used for a mold material. Length A of the lead terminal 10B from the side wall 5B of the case to the front end of the lead terminal is approximately 6.0 mm and the width is approximately 0.4 mm. The width of the root of the base portion is widened to approximately 1.0 mm to provide strength. The staring material is made of phosphor bronze (C-5210H) having a plate thickness of approximately 0.2 mm and is plated with nickel having a thickness of 2 through 5 m. In respect of dimensions of the contact portion 15B of the lead terminal, a length in a direction of extending the lead terminal (contact length) is set to L=0.4 mm. The contact length L is a value for satisfying a condition described in U.S. application Ser. No. 08/608060 where a node of vibration of the transformer element 1 must be supported by an area which does not hamper the vibration (an area of contact between the electrode of the transformer element and the lead terminal 10B must be 0.5% or less of a projected plane area of the transformer element 1, per a unit terminal).

In respect of the length $R_L$ of the curled edge portion of the 17B at the front end of the lead terminal, the length is set to $R_L$=0.2 mm since the length must satisfy $R_L \leq L$ such that the length is shorter than the contact length L to restrain the vibration at that portion to a minimum. In respect of an angle δ of circumference of the curled portion, an angle whereby the frontmost end of the lead terminal is not brought into contact with the electrode of the transformer element 1 even if the inclination of the transformer element 1 is maximized in the package, is needed. Accordingly, when the maximum angle of inclination of the transformer element 1 is set to $\phi = \tan^{-1}(t/w)$, the angle of circumference must be set to $\delta \geq \phi$. According to the embodiment, the angle is set to δ=90 φ=5.7.

The angle of inclination θ of the contact portion 15B of the lead terminal in respect of the transformer element 1, is determined by the amount of displacement Δx of the elastic deformation of the lead terminal 10B and the length A of the lead terminal, and is approximated by a rotational angle $\theta = \tan^{-1}(\Delta x/A)$ in respect of a direction of reaction of a static load received by the lead terminal 10B by supporting the transformer element. According to this embodiment, the inclination is set to θ=about 3. The amount of deformation Δx of the elastic deformation is determined by an interval $W_d$ between the contact faces of the upper lead terminal 10A and the lower lead terminal 10B opposed thereto, and a thickness t of the transformer element and is derived from $\Delta x = (W_d - t)/2$ if the spring-constants of the upper and the lower lead terminals are the same. According to this embodiment the amount of displacement of the elastic deformation is set to Δx=0.3 mm and the transformer element 1 is pressed from the top face and the bottom face by a force of approximately 30 gf in this case.

Figure 21A:
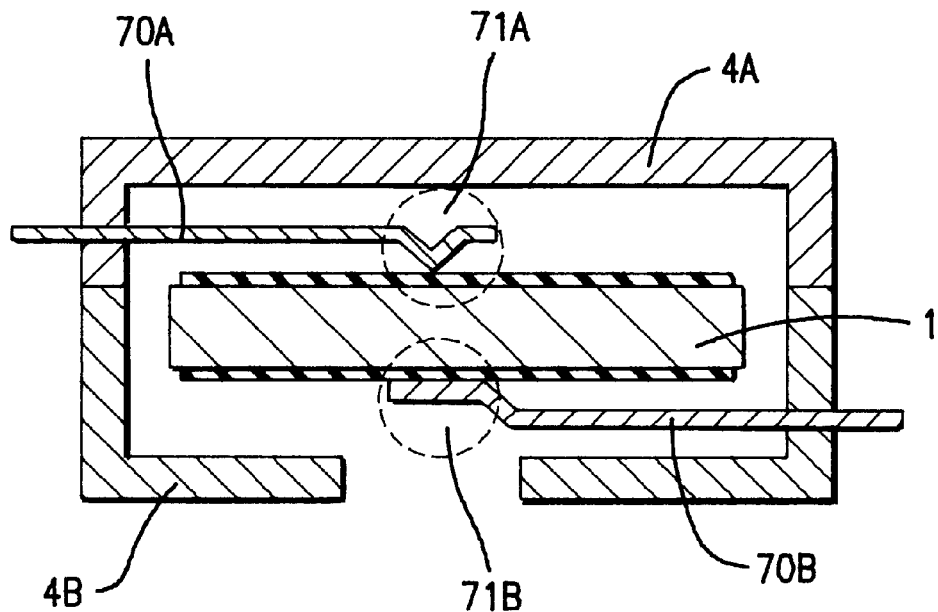
FIGS. 21(a) and 21(b) are respectively a sectional view of the piezoelectric transformer according to U.S. application Ser. No. 08/608060 and a side view showing the state of a lower lead terminal when a piezoelectric transformer element is encapsulated in a package.
Figure 21B:
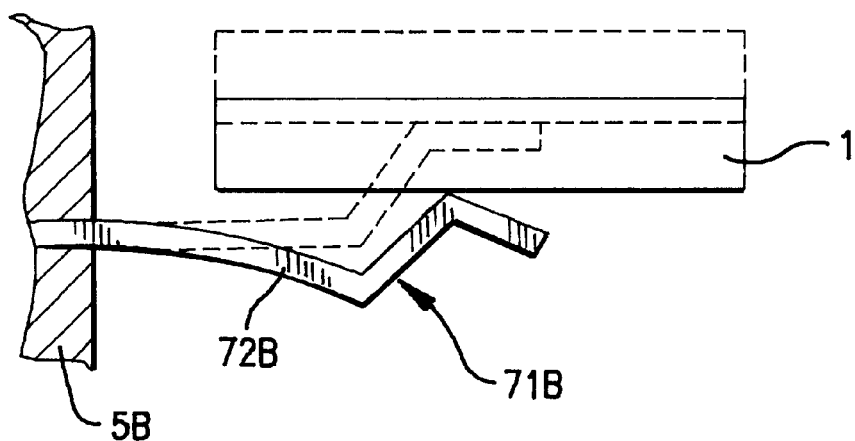

According to the conventional piezoelectric transformer illustrated by FIGS. 21(a) and 21(b), the audible noise (noise) caused in driving the piezoelectric transformer, is heard as a beat, when the vibration of the transformer element 1 is propagated to the lead terminals and induces a vibration of the lead terminal at their natural mode, either of an interference between the natural frequency caused on the lead terminal and the drive frequency of the transformer, an interference between the caused natural frequencies and an interference having a property where these kinds of vibration are mixed, is caused and a difference in the frequencies is caused in a range of audible frequencies. According to this embodiment, as a measure against the audible noise caused thereby, an analysis of eigen value is conducted in designing the lead terminal. The eigen values of the bending mode in the length direction that is a vibration mode which is liable to cause the most, and the torsional mode, are prevented from falling into a range within 20 kHz before and after the drive frequency (110 through 116 kHz) of the transformer element whereby the resonance is prevented. Incidentally, the above-described prevention of resonance can be realized by changing at least one of geometrical dimensions such as the width, the length and the thickness, while fixing physical properties of the starting material of the lead element such as density, Poisson's ratio and Young's modulus. Or conversely, it can also be realized by changing at least one of the above-described physical properties while fixing the dimensions of the lead terminal. Furthermore, it can also be realized by simultaneously changing at least two of the physical properties and the geometrical dimensions of the lead terminal.

In this way, according to this embodiment, the transformer element and the terminal portion of the lead terminal are kept in parallel with each other in a state where the terminal portion 11B of the lead terminal, particularly the contact portion 15B are previously inclined in respect of the transformer element 1 and the transformer element 1 is mounted to the package. As a result, the contact state of the electrode of the transformer element and the lead terminal, is difficult to receive an adverse influence by burrs or plating deposition at the peripheral edge of the lead terminal by which a further smooth contact than that in the conventional transformer, is obtained. Further, the frontmost end of terminal portion of the lead terminal in the direction of extending the lead terminal is curled, and the frontmost end of the lead terminal is prevented from being brought into contact with the electrode forming face of the transformer element and accordingly, a point contact is not caused even at the frontmost end of the lead terminal whereby the smooth contact is obtained.

According to this embodiment, in respect of the contact between the electrode of the transformer element and the lead terminal, dispersion thereof is initially inconsiderable and further, ageing change thereof is also inconsiderable. Therefore, not only a contact state satisfying the binding condition of spring in accordance with the initial design is obtained reproducibly, but the binding condition can be maintained over a long period of time by which the audible noise in operating the transformer can be restrained at a low value. Furthermore, chipping off of the electrode of the transformer element or the contact portion of the lead terminal is improved since the contact between the transformer element and the lead terminal is made smooth by which the reliability of the electric contact is promoted. Also, catching of the contact portion of the lead terminal, instantaneous electric disconnection caused by jumping, or generation of noise is eliminated.

Figure 4A:
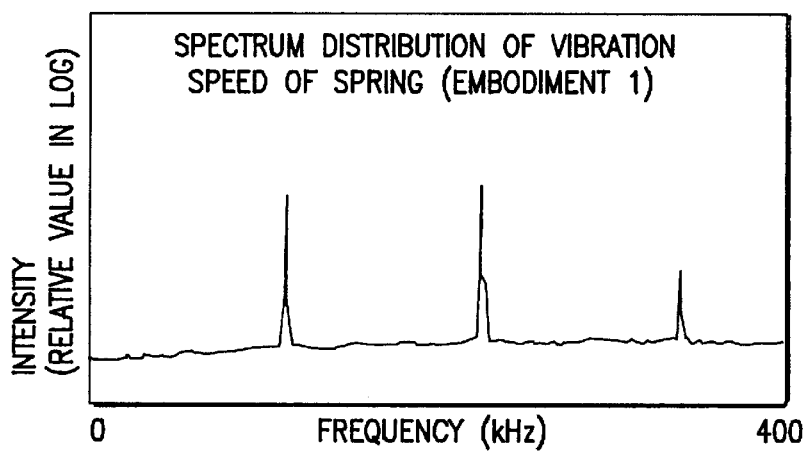
FIGS. 4(*a*) and 4(*b*) are respectively a diagram showing a vibration spectrum of the lead terminal of the piezoelectric transformer according to the first embodiment and a diagram showing a vibration spectrum of a lead terminal of a conventional piezoelectric transformer.
Figure 4B:
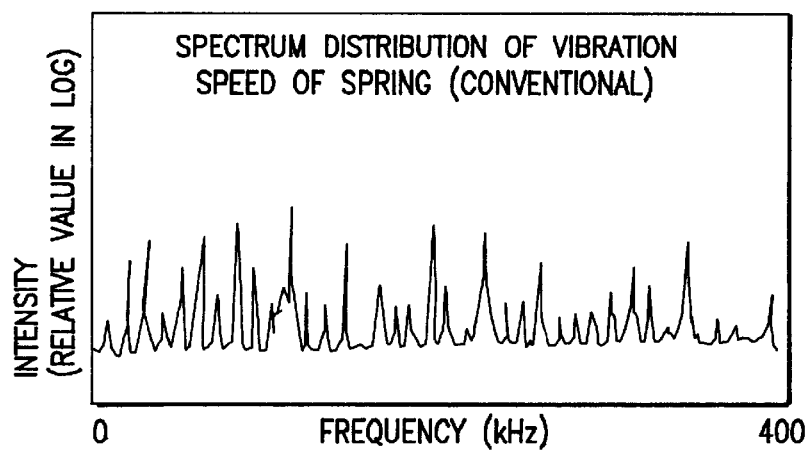

FIGS. 4(a) and 4(b) illustrate the vibration spectra of the lead terminals when respectives of the embodiment and the conventional piezoelectric transformer shown by FIG. 21 are driven. The vibration spectra analysis is conducted by the following way in respect of the vibration state of the lead terminal. That is, in a state where the single body of the piezoelectric transformer is operated by steady state input of 140 $V_{p-p}$, the sweeping is conducted at an input frequency of 110 through 116 kHz and the vibration state of the lead terminal is measured by a laser doppler device. Incidentally, an RC quasi load in compliance with the impedance of a cold cathode tube is used for the output load of the piezoelectric transformer.

FIG. 4(a) shows a vibration spectrum of the lower lead terminal of the piezoelectric transformer according to this embodiment. FIG. 4(b) shows a vibration spectrum of the lower lead terminal of the conventional piezoelectric transformer shown by FIGS. 21(a) and 21(b). Comparing FIG. 4(a) with FIG. 4(b), according to the lead terminal of the this embodiment, there is no generation of vibration modes other than that caused by the input frequency, which are based on a self-excited oscillation of the lead terminal and which is observed in the conventional piezoelectric transformer and it is known that the vibration modes causing the audible noise are improved.

Figure 5:
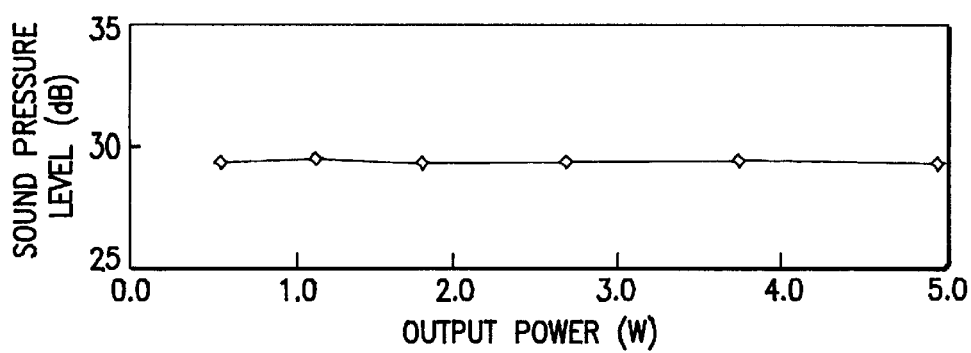
FIG. 5 is a diagram showing a sound pressure level when the piezoelectric transformer according to the first embodiment is operated by an inverter circuit driving substrate.

FIG. 5 is a diagram showing a sound pressure level when the piezoelectric transformer according to this embodiment is operated by an inverter circuit driving substrate. The sound pressure in driving the transformer is measured by a sound pressure measuring instrument by arranging samples to be measured in a soundproofing box. As a load applied on the piezoelectric transformer, a load of a cold cathode tube used in a liquid crystal back light is used. As shown by FIG. 5, the sound pressure level of this embodiment stays at a sound pressure level of background (A characteristic sound pressure level) in a range of output power of 0.5 through 5.0 W. The piezoelectric transformer is normally used at the output power of 2 through 3 W and accordingly, the piezoelectric transformer is found to stay stable even with an operational power about 1.7 times as large as the electric power in the normal operation.

Next, an evaluation similar to the above-described is conducted after executing the following reliability test whereby results similar to the above-described are reproduced in any of the tests and the reliability of contact is confirmed.

(Reliability test)
① Vibration test (X, Y and Z directions, 2 G, 2 hr, respectively)
② Impact test (X, Y and Z directions, 10 G, 5 times, respectively)
③ High temperature high humidity leaving test (60 C., 85% RH (relative humidity), 20 hr)
④ High temperature operation test (60 C., 240 hr)
⑤ Temperature cycle test (−20–70 C., 100 cycle)

Incidentally, heretofore, an explanation has been given of examples where phosphor bronze is used as the material of the lead terminal, nickel is used as the material of plating, and a liquid crystal polymer (trade name: ZEONITE 7130, made by Du Pont Corporation) is used as the mold resin, however, the present invention is not limited thereto. It is confirmed that a similar effect is obtained by using 42 nickel alloy, brass or beryllium copper as the material of the lead terminal, tin, gold, solder, indium, palladium or composites of these as the material of plating and liquid crystal polymers of other makers (trade name: Sumika Super made by Sumitomo Chemical Co. Ltd., trade name: Vectora made by Nippon Polyplastic Co. Ltd., trade name: NOVAC CURATE made by Mitsubishi Kasel Corporation etc.)

Further, when similar tests are conducted by using packages each having the dimensions and shape the same as those of this embodiment and with respect to samples where the radius of curvature, arc length $R_L$, the angle of circumference of the edge portion 17B at the front end of the terminal portion, are changed, a similar effect is obtained even with the contact length L=0.4 mm, outer radius of curvature of 1.0 mm, the length of $R_L$=0.24 mm and angle of curvature of 14.

(Embodiment 2)

Figure 6A:
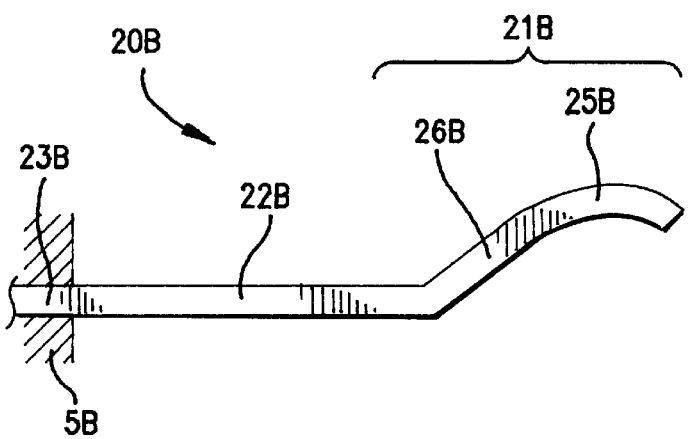
FIGS. 6(*a*) and 6(*b*) are respectively a side view and a perspective view of a lower lead terminal used in a piezoelectric transformer encapsulated in a package according to a second embodiment of the present invention.
Figure 6B:
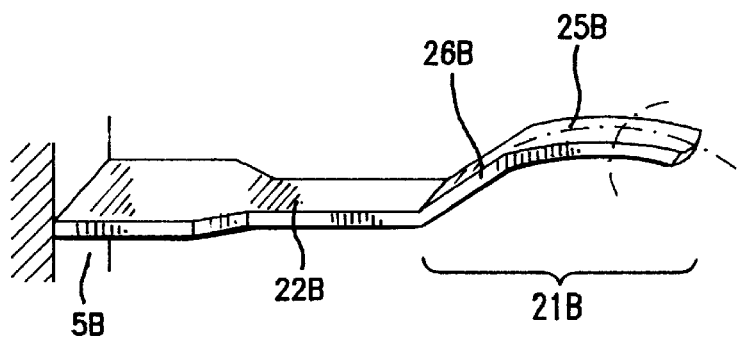

Next, an explanation will be given of Embodiment 2 of the present invention. FIG. 6(a) and FIG. 6(b) are respectively a side view and a perspective view of a lower lead terminal 20B used in a piezoelectric transformer according to Embodiment 2 of the present invention. These figures respectively illustrate a shape of the lead terminal 20B where no load is applied on the lead terminal 20B. Comparing FIGS. 6(a) and 6(b) with FIGS. 1(a) and 1(b), in respect of the piezoelectric transformer of this embodiment, the structure of terminal portions of an upper lead terminal 20A and the lower lead terminal 20B, is different from that of the lead terminals used in Embodiment 1. The piezoelectric element transformer 1 and the snap fit structure (refer to FIG. 20(b)) of the upper case 4A and the lower case 4B, stay the same as those in Embodiment 1.

An explanation will be given of the structure of the lead terminal used in this embodiment with the lower lead terminal 20B as an example. Referring to FIGS. 6(a) and 6(b) showing the shape of the lower lead terminal 20B, a terminal portion 21B of the lower lead terminal 20B is constituted by a contact portion 25B that is to be brought into contact with the electrode forming face of the transformer element and a connecting portion 26B for connecting the contact portion 25B to a base portion 22B of the lead terminal. This embodiment is characterized in that the contact portion 21B has a face of a curvature as if a spherical shell were cut along a long axis. According to Embodiment 1, the contact portion 15B (refer to FIGS. 1(a) and 1(b)) of the lead terminal is flat and the edge portion 17B in a curled shape is provided on the side of the front end in the direction of extending the lead terminal. According to this embodiment, the curled portion is dispensed with on the front end side of the contact portion 25B. The face of a curvature of the contact portion 21B is formed by pressing. Incidentally, similar to Embodiment 1 the cut face of the spherical shell at the contact portion 21B is previously inclined in respect of the base portion 22B of the lead terminal such that the lead terminal is opened toward the direction of extending the lead terminal when no load is applied on the lead terminal by the transformer element.

Figure 7A:
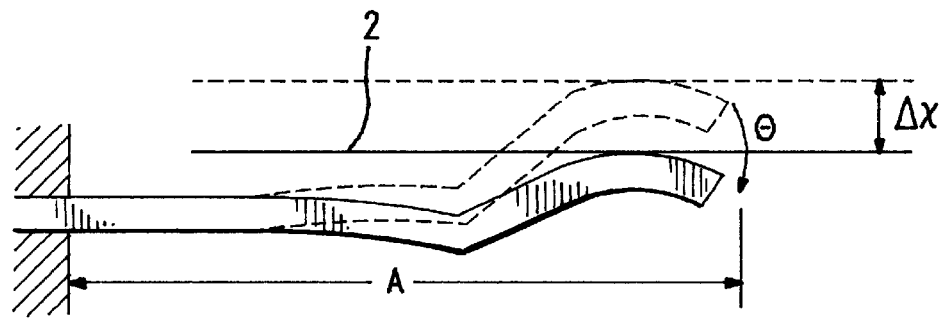
FIGS. 7(*a*) and 7(*b*) are respectively a side view schematically showing a state of the lower lead terminal of the piezoelectric transformer encapsulated in a package according to the second embodiment, and a side view schematically showing a case where a state of supporting the lower lead terminal in respect of a transformer element is extremely deviated.

FIG. 7(a) is a side view schematically showing a state of the lower lead terminal when the transformer element is mounted to the inside of a package having the lead terminals as illustrated by FIGS. 6(a) and 6(b). Referring to FIG. 7(a), when the transformer element 1 is mounted to the package, the lead terminal 20B receives a static load from the electrode forming face 2 of the transformer element 1 and starts to bend from a state where a force for supporting the transformer element 1 is not generated (shown by the broken lines in the drawing), in other words, a state where a displacement amount of Δx of elastic deformation of the lead terminal 20B is 0. Further, a rotation is caused in the lead terminal 20B with a side wall 5B of the case at the base portion 22B as a fulcrum in accordance with the above-described elastic deformation (shown by the solid lines in the drawing). At this moment, the contact portion 25B having previously an inclination with respect to the transformer element 1, is gradually going to be in parallel with the transformer element 1. Finally, the contact portion 25B parallelly supports the transformer element 1 at a stationary state where the lead terminal is pushed down by a predetermined distance. As a result, the contact portion 25B of the lead terminal and a lower electrode of the transformer element are brought into contact with each other by a face whereby excellent contact is obtained. Different from the conventional piezoelectric transformer, even if burrs in punching out operation or deposition of plating are present at a peripheral edge of the lead terminal 20B, a point contact is not produced. A line contact is created at the peripheral edge portion of the contact portion 25B and accordingly, a contact smoother than that of the conventional case is produced, whereby local wear of the electrode of the transformer element or jumping of the lead terminal is significantly improved.

Figure 7B:
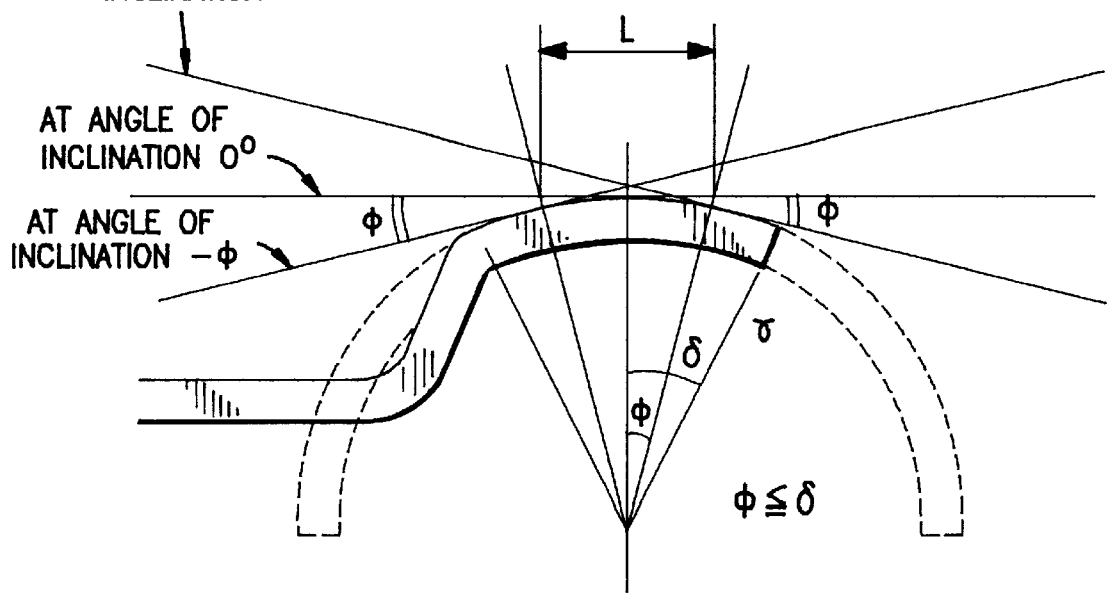

Next, FIG. 7(b) is a side view schematically showing a case where the supporting state of the lead terminal 20B in respect of the transformer element 1 is extremely deviated. In order to prevent the contact between the electrode of the transformer element and the lead terminal from hampering the vibration of the transformer element in this embodiment, as described in U.S. application Ser. No. 08/608060, an area of the contact portion 25B must be 0.5% or lower of the projected plane areas of the transformer element 1. The area of the contact portion 25B ($=(L/2)^2$ where L is a diameter of the spherical contact portion 25B) is made 0.5% or less of an area S of the electrode with which the lead terminal is to be brought into contact. That is, L 2 (0.005S/)=0.944 is satisfied. In this embodiment, the length of the input electrode is 14 mm per input electrode and therefore, S=14× 10=140 mm².

Also, to provide smooth contact, the frontmost end of the curved contact portion 25B of the lead element must not be brought into contact with the electrode forming face of the transformer element such that the contact between the electrode of the transformer element and the lead terminal does not create a point contact even in the case where a maximum inclination (angle=φ; φ=tan⁻¹(t/w)=5.7 the same as that in Embodiment 1) is caused in the transformer element. For that purpose, if an angle of circumference of the face of a curvature and a radius of curvature are respectively designated as δ and r, relationships of δ φ and (L/2) 2 r (φ/360) in respect of the contact length L must be satisfied.

In this embodiment, S=140 mm² and the maximum inclination angle of the transformer element is set to φ=5.7 and accordingly, the contact length of the lead terminal is set to L=0.4 mm (=lead terminal width), the angle of circumference of the face of curvature is set to δ=14 and the radius of curvature is set to r=15 mm. Also, the inclination angle θ of the contact portion 25B of the lead terminal in respect of the transformer element 1 and the deformation amount Δx of the elastic deformation are set to θ=3 and Δx=0.3 mm and the transformer element 1 is pressed by the upper and lower lead terminals by a force of about 30 gf from its top face and bottom face similar to those in Embodiment 1. Thereby, the respective conditions are satisfied as follows.

$L=0.4\ 2\ (0.005S/)=0.944$ $δ=14\ φ=\tan^{-1}(t/w)=5.7$ $r=15\ 180L/(2φ)=180×0.4/2×0.57\sim 20$ That is, a contact structure where even if the maximum inclination angle φ is caused in the transformer element 1, the contact portion 25B of the lead terminal is disposed within a range of 0.2 mm from the node of the electrode face of the transformer element, hampering of vibration of the element is restrained to a minimum and the frontmost end of the contact portion of the lead element is not brought into contact with the electrode face of the transformer element, is realized.

According to this embodiment, a contact of burrs or deposition of plating at the peripheral edge of the contact portion to the transformer element or a partial contact such as a point contact caused by a deformation by a load from outside are dispensed with by providing the contact portion 25B of the lead terminal with the face of a curvature whereby not only the close contact performance of the lead terminal in respect of the transformer element 1 is promoted but constant binding conditions of spring can always be realized reproducibly and maintained for a long period of time.

Incidentally, even if the same materials as those in Embodiment 1 are used for the mold material, the starting material of the lead element, the material of plating the lead terminal, an effect similar to the above-described can naturally be achieved. Further, the radius of curvature r of the contact portion 25B of the lead terminal is not necessarily r=180L/(2φ) so far as the lead terminal is provided with dimensions and shape whereby the frontmost end of the contact portion 25B in the direction of extending the lead terminal is not brought into contact with the electrode of the transformer element 1. An effect similar to the above-described is achieved even with the dimensions of the lead terminal of Embodiment 2 except the radius of curvature of the contact portion 25B defined as r=0.5 180L(2φ). Further, the face with a curvature of the contact portion 25B of the lead terminal may not be necessarily that of a spherical shape but may be that of a shape of a shell of an ellipsoid of revolution, or a shape where an egg shell is cut in the longitudinal direction, or an asymmetrical shape in the direction of extending the lead terminal which has a recessed portion of a spoon.

(Embodiment 3)

Figure 8A:
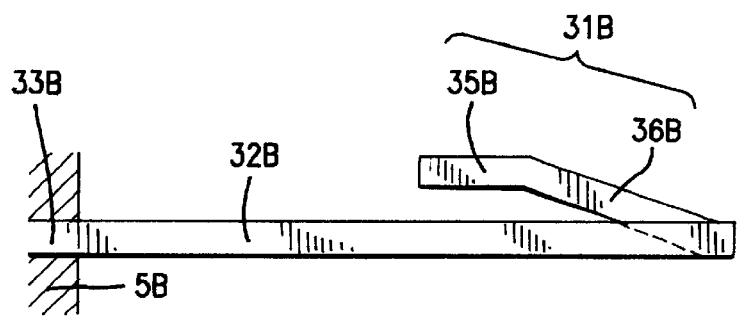
FIGS. 8(*a*), 8(*b*), 8(*c*) and 8(*d*) are respectively a side view and a perspective view of a lower lead terminal used in a piezoelectric transformer encapsulated in a package according to a third embodiment of the present invention, a sectional view of the piezoelectric transformer mounted to a package and a side view schematically showing a state of the lower lead terminal.
Figure 8B:
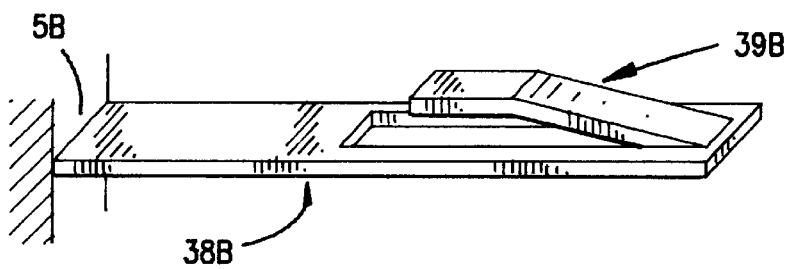

Next, an explanation will be given of Embodiment 3 of the present invention. FIG. 8(a) is a side view of a lower lead terminal 30B used in a piezoelectric transformer according to Embodiment 3 of the present invention. FIG. 8(b) is a perspective view thereof. These figures show a shape of the lead terminal 30B where no load is applied thereon. Referring to FIGS. 8(a) and 8(b), the lead terminal 30B according to this embodiment is provided with the structure of a cantilever one side of which is embedded in a side wall 5B of the case and with a shape where a portion of a base portion 32B is punched out and bent from the front end of the lead terminal opposed to an embedded portion 33B contiguous to the base portion 32B of the lead terminal whereby a connecting portion 36B is formed. The connecting portion 36B is provided with a structure where it is raised toward the side wall 5B of the case from the base portion 32B of the lead terminal. The front end portion of the connecting portion 36B on the side of the side wall 5B of the case is made in parallel with the base portion 32B of the lead terminal and the parallel and flat portion constitutes a contact portion 35B. The structure of the lead terminal 30B can be regarded as a spring structure integrated with a first leaf spring 38B comprising the base portion 32B with the side wall 5B of the case as a fulcrum and a second leaf spring 39B comprising the connecting portion 36B with an onset portion of punching and bending the front end thereof on the side opposed to the embedded portion 33B of the first leaf spring 38B as a fulcrum.

Figure 8C:
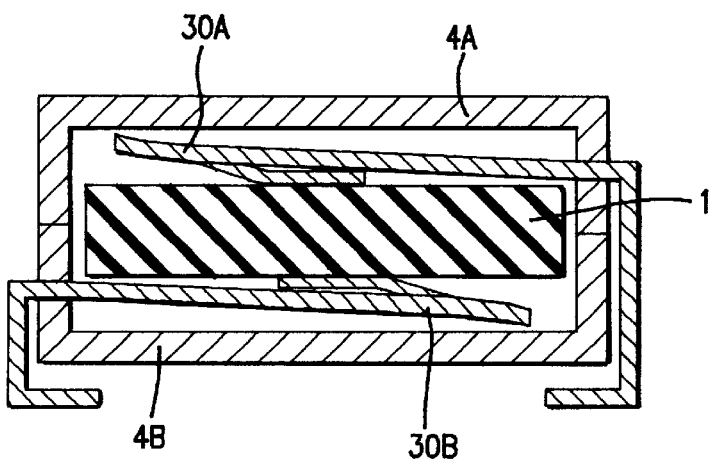

FIG. 8(c) is a sectional view illustrating the piezoelectric transformer element 1 mounted to a package having the lead terminals of the above-described structure. Referring to FIG. 8(c), the transformer element 1 is provided with the structure where it is pinched by the upper lead terminal 30A and the lower lead terminal 30B by a constant spring force. The package is constituted by an upper case 4A and a lower case 4B and the upper lead terminal 30A and the lower lead terminal 30B are embedded to the respective cases in the state of a cantilever. In respect of fitting the upper case 4A to the lower case 4B, they can be simply integrated by a snap fit structure similar to that in Embodiment 1.

Figure 8D:
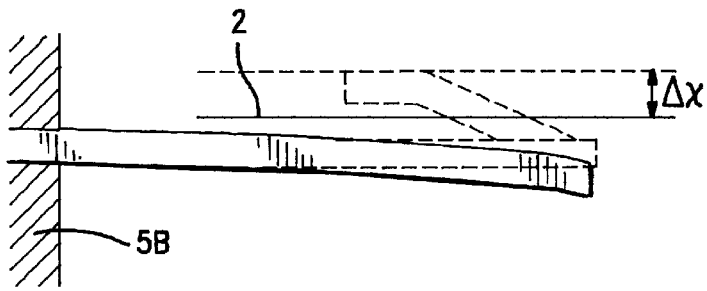

FIG. 8(d) is a side view schematically showing a state of the lower lead terminal when the transformer element is mounted to the inside of the package having the lead terminals as shown by FIGS. 8(a) and 8(b). Referring to FIG. 8(d), when the transformer element 1 is mounted to the package, the lead terminal 30B receives a static load from the electrode forming face of the transformer element 1 and starts to bend from a state where a force for supporting the transformer element 1 is not generated (shown by the broken lines in the drawing), in other words, a state where the deformation amount $\Delta x$ of the elastic deformation of the lead terminal 30B is 0. Further, a rotation is caused with the side wall 5B of the case at the base portion 32B as a fulcrum, is caused in the first leaf spring 38B in accordance with the above-described elastic deformation (shown by the solid lines in the drawing). The rotation is in a direction of rotating a contact portion 35B to the right side of the drawing. Meanwhile, at the same time, with respect to the second leaf spring 39B, the connecting portion 36B is gradually pushed down whereby a rotation is caused with the onset portion of punching and bending at the front end of the first leaf spring 38B as a fulcrum. This rotation is in a direction of rotating the contact portion 35B to the left side of the drawing. As a result, the contact portion 35B is always kept in parallel with the transformer element 1 since the right rotation by the first leaf spring 38B and the left rotation by the second leaf spring 39B cancel each other. That is, even if the total of the lead terminal 30B is pushed down by a predetermined distance and the elastic deformation is caused in the integrated state shown by FIG. 8(c), the contact between the piezoelectric transformer element 1 and the contact portion 35B keeps a face contact whereby excellent contact is obtained. Different from the conventional piezoelectric transformer, even if burrs in punching or deposition in plating is present at the peripheral edge of the contact portion 35B, a point contact is not created. Since a line contact is produced at the peripheral edge of the contact portion 35B, a contact state smoother than that in the conventional case is produced whereby local wear of the electrode of the transformer element and jumping of the lead terminal are significantly improved.

A detailed explanation will be given of the lead terminal according to this embodiment as follows. As a starting material, a material made of phosphor bronze (C-5210H) with a plate thickness of 0.2 mm and a surface plated with nickel having a thickness of 2 through 5 m, is used. The dimensions of the first leaf spring 38B are width 1.6 mm×length 9.3 mm. The dimensions of the second leaf spring 39B are width 0.6 mm×length 3.45 mm and the dimensions of the contact portion 35B are width 0.6 mm×length 0.6 mm. A gap between the base portion 32B of the first leaf spring and the contact portion 35B of the second leaf spring is set to 0.5 mm. The lower lead terminal 30A and the upper lead terminal 30B having such a structure are embedded to the side walls 5A and 5B of the cases by an insert molding process by which the upper case 4A and the lower case 4B are fabricated. The spring constant of the lead terminal is 75 gf/mm. Further, the transformer element 1 having the dimensions of 42 mm×10 mm×1 mm is inserted between the lower case 4B and the upper case 4A whereby the piezoelectric transformer encapsulated in the package according to this embodiment is obtained. The mold resin of the case, the starting material of the lead terminal, the material for plating the lead terminal and the material for the transformer element and the like constituting this embodiment, may use the materials quite the same as those used in Embodiment 1 and Embodiment 2.

According to the piezoelectric transformer of this embodiment, transformer element and the lead terminals are always brought into parallel contact with each other despite an amount of pushing the lead terminals. According to this embodiment, margins in respect of dispersions in fabricating respective parts, deformations thereof by ageing change, design change of spring forces for supporting the transformer element and the like may be increased by which a piezoelectric transformer more stable than those of Embodiment 1 and Embodiment 2 can be realized.

Figure 9A:
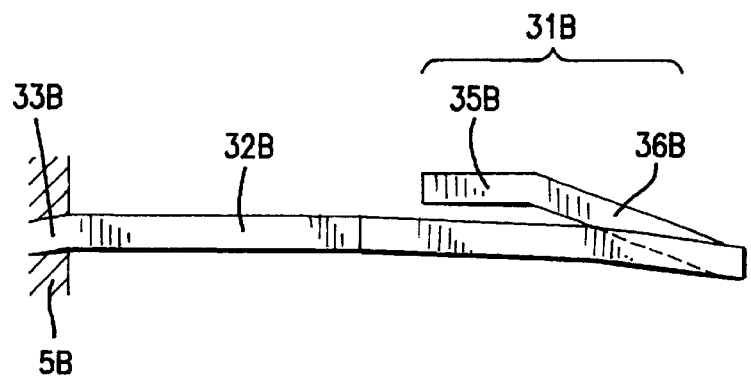
FIGS. 9(*a*) and 9(*b*) are respectively a side view and a perspective view showing a modified example of the lower lead element used in the third embodiment of the present invention.
Figure 9B:
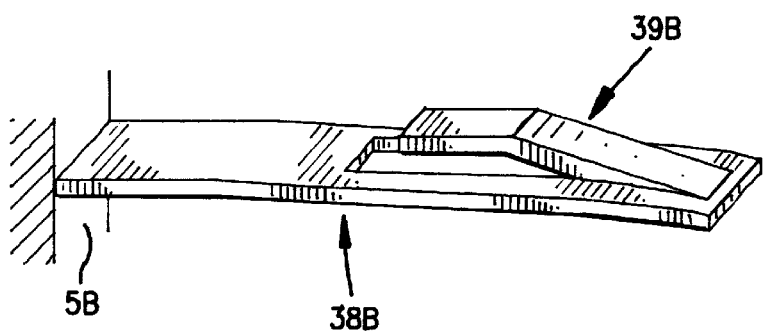

Incidentally, according to this embodiment, an explanation has been given of an example where the base portion 32B of the lead terminal constituting the first leaf spring 38B is linearly elongated in the direction of extending the lead terminal. However, as illustrated by a side view of FIG. 9(a) and a perspective view of FIG. 9(b), the shape of the base portion 32B may be changed to a shape that is a little curved in the direction of extending the lead terminal by which a shape whereby the punching and bending operation of the second leaf spring 39B is conducted smoothly, is produced. In this way according to this embodiment, the load strength of the fulcrum of the second leaf spring 39B can be increased. Incidentally, an effect similar to the above-described can be achieved even if the structure of the contact portion 35B at the front end portion of the second leaf spring 39B is changed into a structure where curled portions are provided before and after the contact portion as in those of Embodiment 1, or a structure of a face of a curvature as that of Embodiment 2.

(Embodiment 4)

Figure 10A:
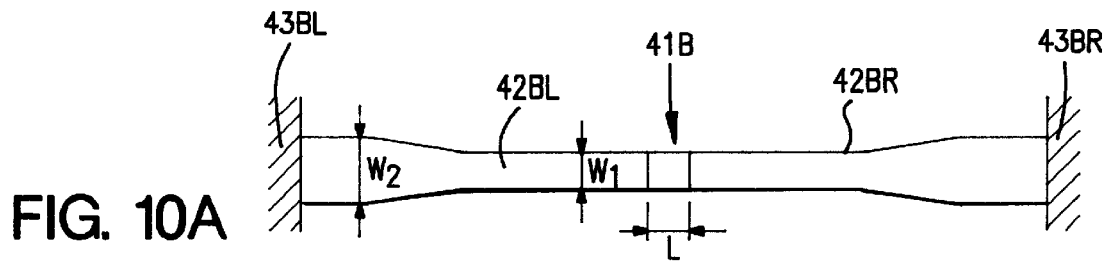
FIGS. 10(*a*), 10(*b*), 10(*c*) and 10(*d*) are respectively a plane view and a side view of a lower lead terminal used in a piezoelectric transformer encapsulated in a package according to a fourth embodiment of the present invention, a sectional view of the piezoelectric transformer mounted in the package and a side view schematically showing a state of the lower lead terminal.
Figure 10B:
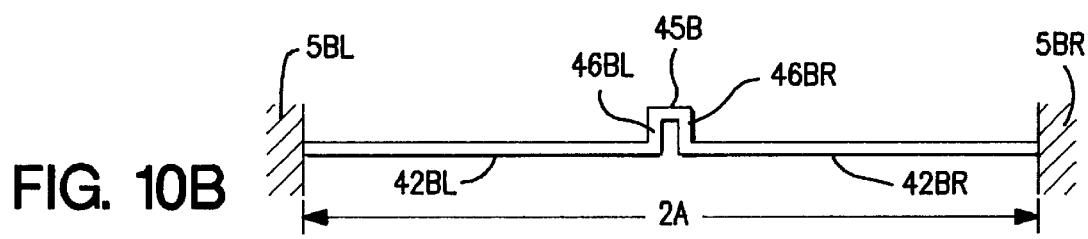

Next, an explanation will be given of Embodiment 4 of the present invention. FIG. 10(a) is a plane view of a lower lead terminal 40B used in a piezoelectric transformer according to Embodiment 4 of the present invention. FIG. 10(b) is a sectional view thereof. These figures show a shape of the lead terminal 40B where no load is applied thereon. Referring to FIGS. 10(a) and 10(b), the lead terminal 40B in this embodiment is provided with a structure of a beam supported at both ends thereof where the both ends are embedded into side walls 5BL and 5BR of each of two opposed cases. A terminal portion 41B is provided at the center between two left and right embedding portions 43BL and 43BR. The terminal portion 41B is provided with a shape where a member having a section of an inversed channel is erected. That is, the lead terminal comprises two left and right connecting portions 46BL and 46BR connecting a contact portion 45B to two left and right base portions 42 BL and 42BR and supporting the contact portion 45B. The lead terminal 40B is provided with a structure receiving the electrode of the transformer element 1 by a face of the flat contact portion 45B.

Figure 10C:
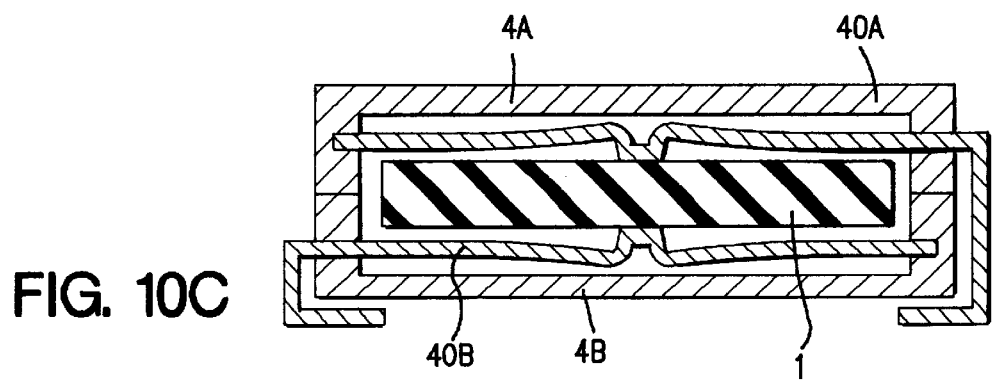

FIG. 10(c) is a sectional view showing the total of the piezoelectric transformer when the piezoelectric transformer element 1 is mounted to a package having the lead terminals with the above-described structure. Referring to FIG. 10(c), the transformer element 1 is provided with a structure where it is pinched by the upper lead terminal 40A and the lower lead terminal 40B by a constant spring force. The package is constituted by the upper case 4A and the lower case 4B and the upper lead terminal 40A and the lower lead terminal 40B are embedded into the respective cases in the state where both ends thereof are supported thereby. The embedded portions 43BR and 43BL each is provided with recessed portions and a mold resin enters the recessed portions by which the lead terminals are fixed and the strength is ensured. In respect of fitting the upper case 4A and the lower case 4B, they can be integrated simply by a snap fit structure similar to that in Embodiment 1. Dimensions of the transformer element 1 are length 42 mm×width 10 mm×thickness 1 mm similar to those in Embodiment 1. In encapsulating the transformer element 1 to the package, a clearance between the lead terminal 40B and the case 4B is 0.2 mm, an amount of pushing the spring of the lead terminal 40B is 0.5 mm and a wall thickness of a mold for embedding the lead terminal by an insert molding process, is 1.5 mm. Thereby, the package having the outside dimensions of 45 mm×13 mm×3.7 mm is fabricated.

Figure 10D:
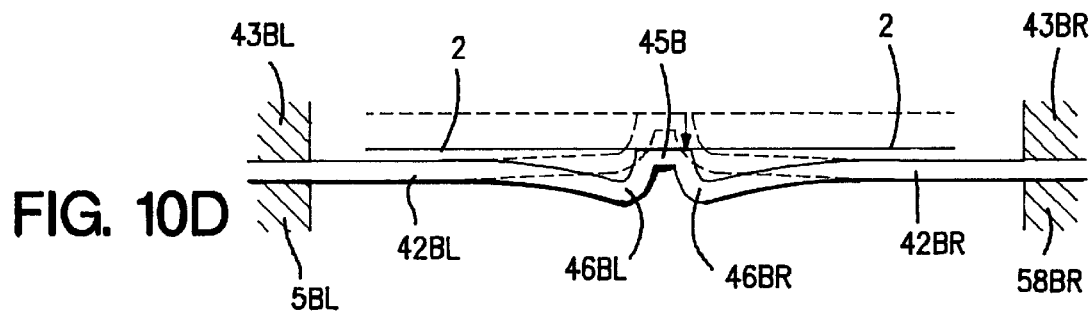
Figure 11A:
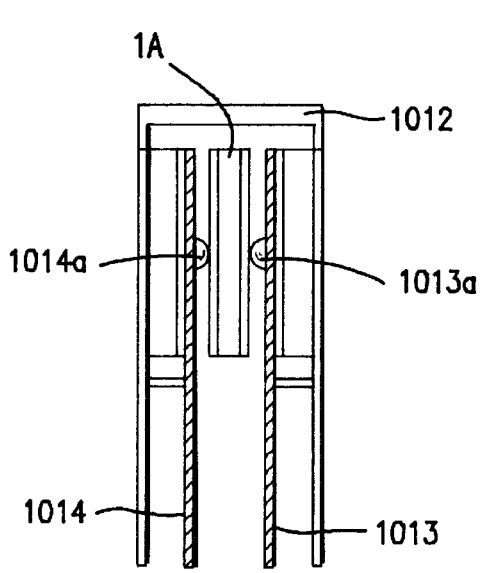
FIGS. 11(*a*) and 11(*b*) are respectively a sectional view of a piezoelectric part according to Japanese Unexamined Utility Model Publication No. JU-A-63-40018 and a perspective view of a support terminal used therefor.
Figure 12A:
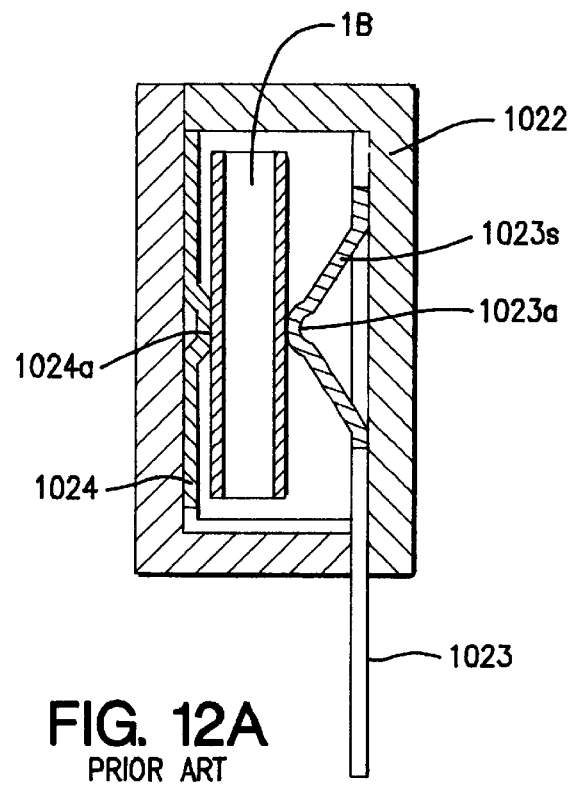
FIGS. 12(*a*) and 12(*b*) are respectively a sectional view of a piezoelectric resonator part according to Japanese Unexamined Utility Model Publication No. JU-A-4-85823 and a front view of a spring terminal used therefor.
Figure 11B:
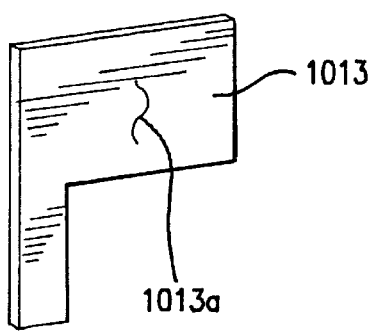
Figure 12B:
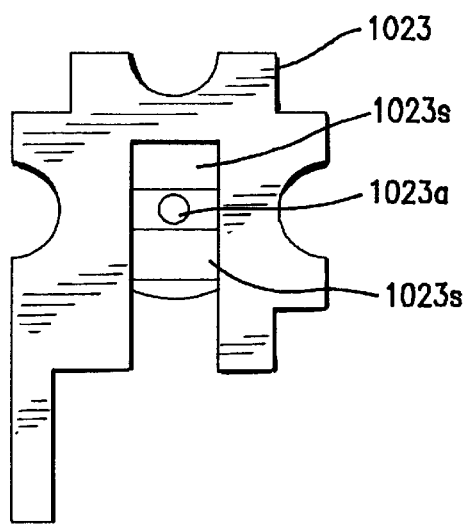
Figure 13A:
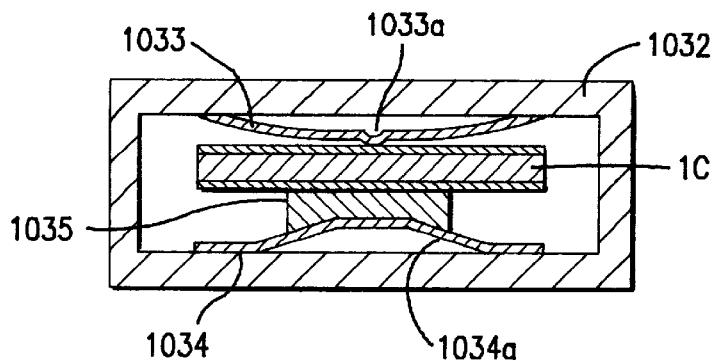
FIGS. 13(*a*) and 13(*b*) are respectively a sectional view of a piezoelectric element according to Japanese Unexamined Utility Model Publication No. JU-A-60-55117 and a side view and a plane view of a support terminal used therefor.
Figure 13B:
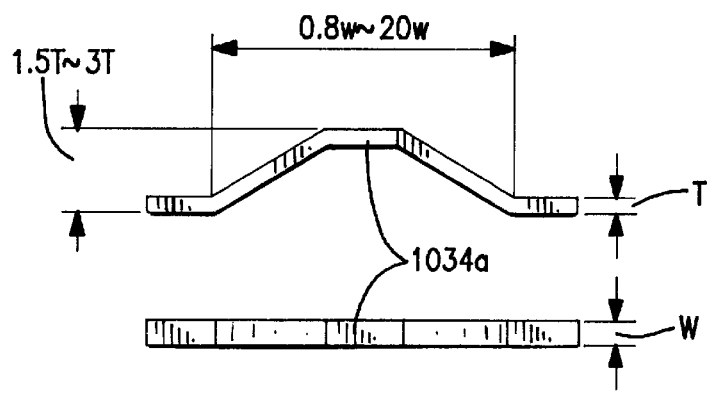
Figure 15A:
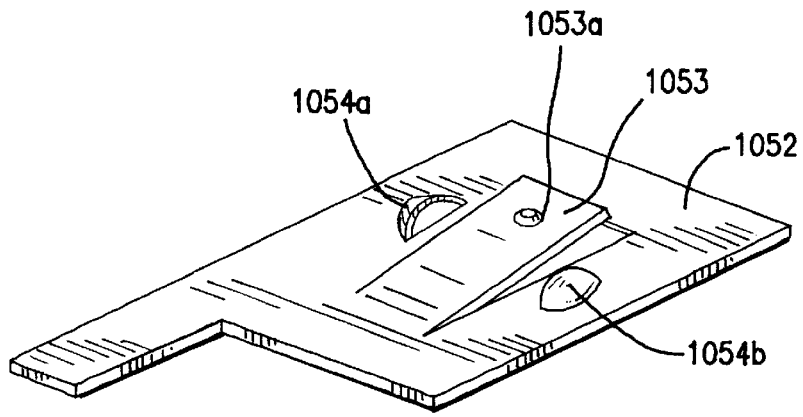
FIGS. 15(*a*) and 15(*b*) are respectively a perspective view of a supporting body used in a piezoelectric vibration part according to Japanese Unexamined Utility Model Publication No. JU-A-63-40019 and a sectional view showing a state of supporting a piezoelectric element by using the supporting body.
Figure 15B:
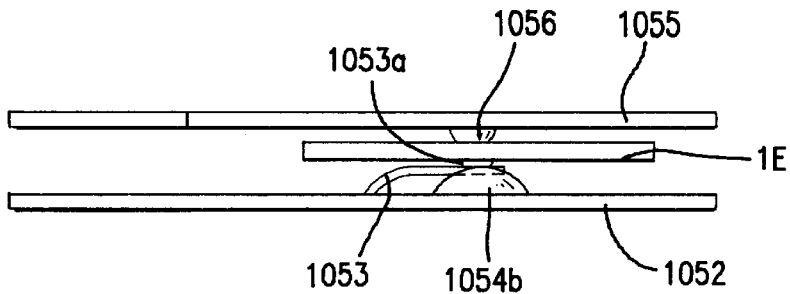
Figure 14A:
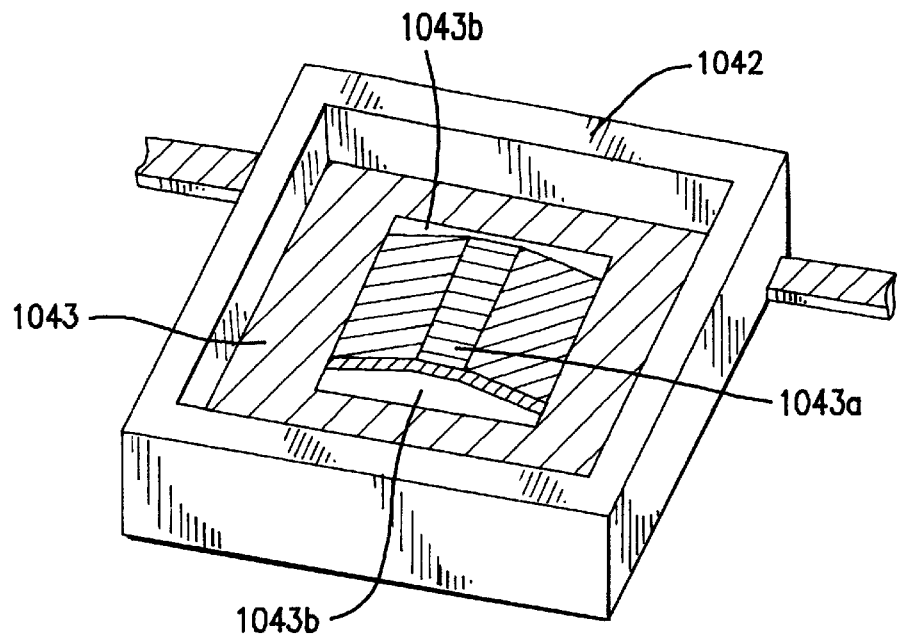
FIGS. 14(*a*) and 14(*b*) are respectively a perspective view of a case used for a ceramic resonator according to Japanese Unexamined Patent Publication No. JP-A-61-18209 and a sectional view of the ceramic resonator.
Figure 14B:
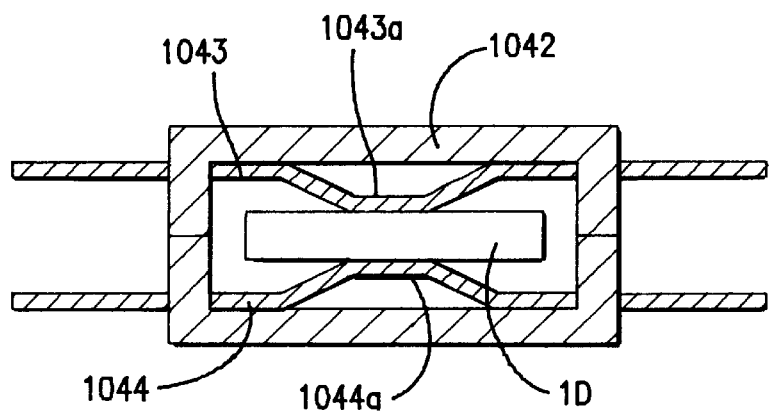
Figure 16A:
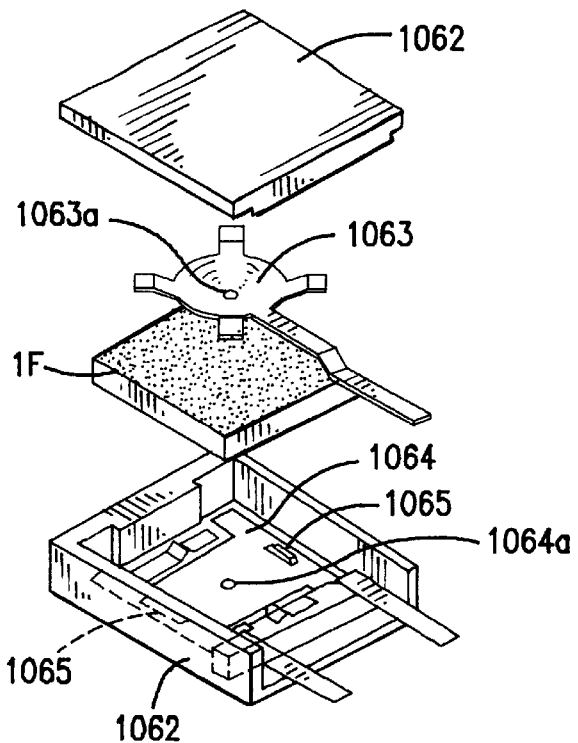
FIGS. 16(*a*) and 16(*b*) are respectively an exploded perspective view of an electronic part according to Japanese Unexamined Utility Model Publication No. JU-A-63-136425 and a perspective view of an elastic support piece used therefor.
Figure 16B:
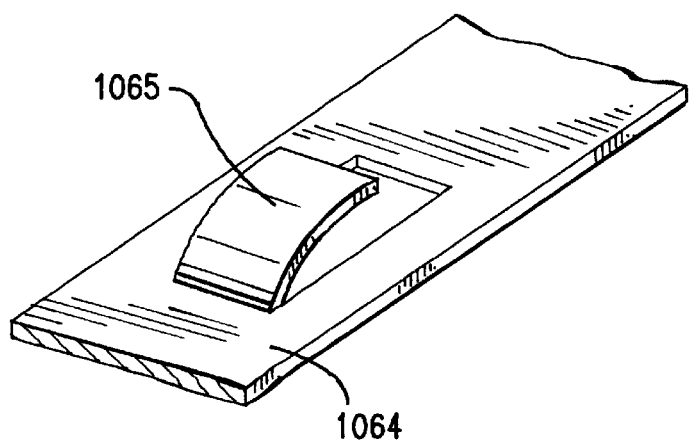
Figure 17A:
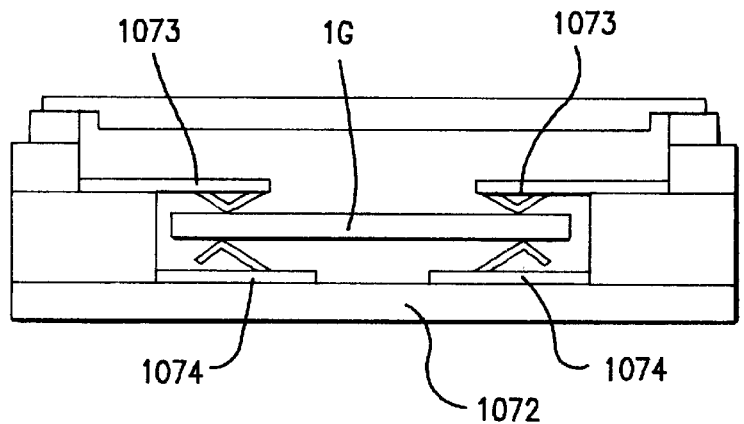
FIGS. 17(a) and 17(b) are respectively a sectional view of a surface mounting quartz oscillator according to Japanese Unexamined Patent Publication No. JP-A-4-35514 and a perspective view of a supporting body used therefor.
Figure 17B:
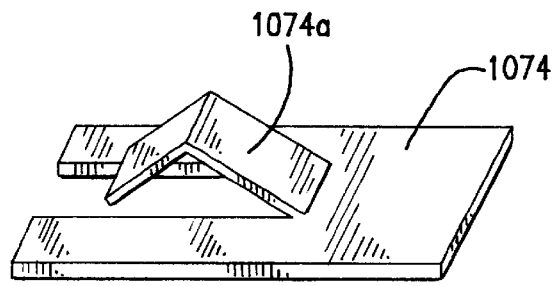
Figure 18:
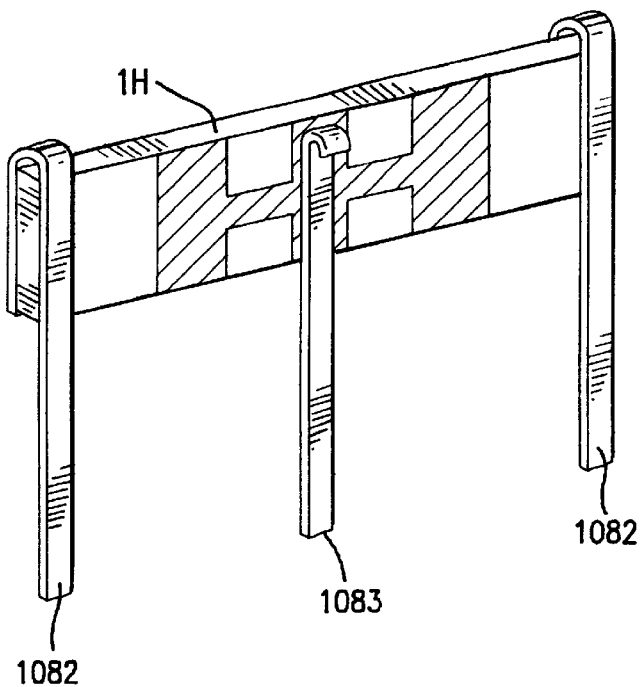
FIG. 18 is a perspective view of a piezoelectric part according to Japanese Unexamined Utility Model Publication No. JU-A-4-85824.
Figure 19A:
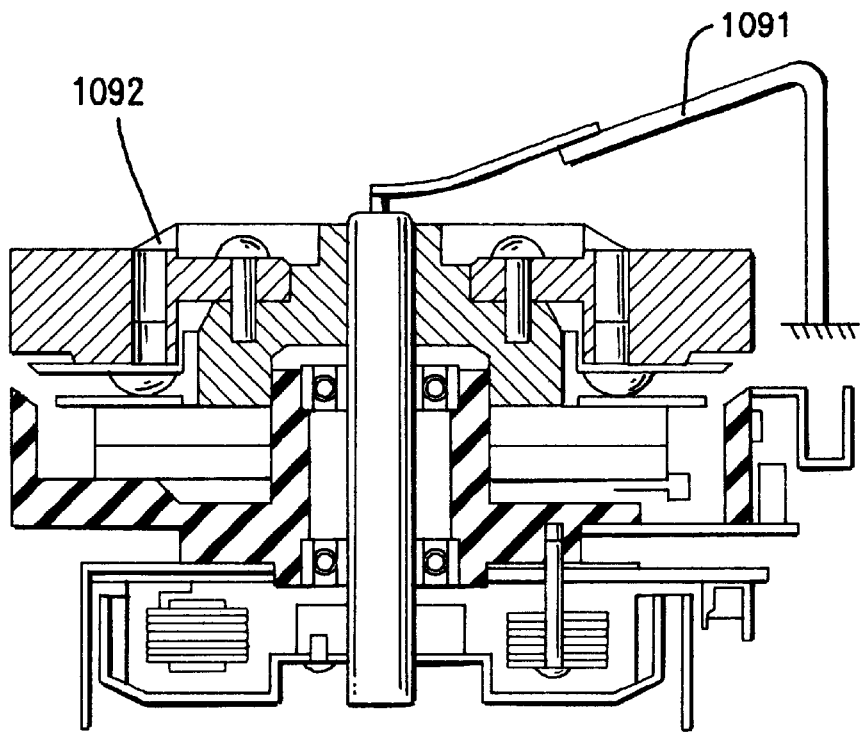
FIGS. 19(a) and 19(b) are respectively a sectional view of a rotating magnetic head drum according to Japanese Unexamined Patent Publication No. JP-A-2-110811 and a plane view of a grounding brush used therefor.
Figure 19B:
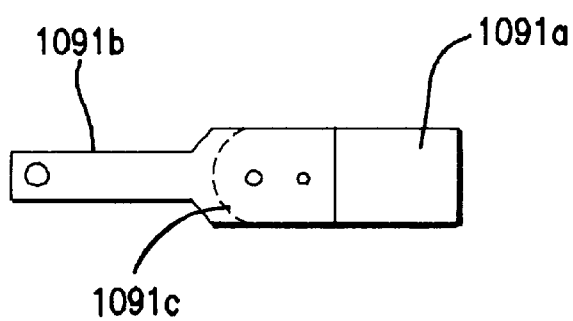

FIG. 10(d) is a side view schematically showing a state of the lower lead terminal when the transformer element is mounted to the inside of the package having the lead terminals as shown by FIGS. 10(a) and 10(b). Referring to FIG. 10(d), when the transformer element 1 is mounted to the package, the lead terminal 40B receives a static load from the electrode forming face of the transformer element 1 and the lead terminal starts to bend from a state where a force for supporting the transformer element 1 is not generated (shown by the broken lines in the drawing), in other words, a state where the deformation amount Δx of the elastic deformation of the lead terminal 40B is 0. Further, rotations with side walls 5BL AND 5BR in the case as fulcrums are caused in the base portions 42BL and 42BR in accordance with the above-described elastic deformation (shown by the solid lines in the drawing). However, at this moment both ends of the contact portion 45B are respectively fixed to the two base portions 42BL and 42BR via the connecting portions 46BL and 46BR and accordingly, the connecting portions 46BL and 46BR are gradually opened in accordance with pressing down the lead terminal. The contact portion 45B is lowered while keeping in parallel with the transformer element 1. According to the operation, although the contact portion 45B were to be rotated by the rotations caused in the base portions 42BL and 42BR, the rotations with the front ends of the base portions 42BL and 42BR as base points of rotation are respectively caused in directions of canceling the above-described rotation of the contact portion 45B by deformations of the two connecting portions 46BL and 46BR and as a result, the contact portion 45B can be kept in parallel with the transformer element 1. In this way, according to this embodiment the contact portion 45B of the lead terminal is always kept in parallel to the transformer element 1. That is, even when a total of the lead terminal 40B is pushed down by a predetermined distance and is elastically deformed in the integrated state shown by FIG. 10(c), the contact between the piezoelectric transformer element 1 and the contact portion 45B is kept in a face contact whereby excellent contact is achieved. Even if burrs in punching or deposition of plating are present at the peripheral edge of the contact portion 45B, a point contact is not produced, different from the conventional piezoelectric transformer. A line contact is created at the peripheral edge of the contact portion 45B and accordingly, a contact state smoother than that in the conventional transformer is achieved and local wear of the electrode of the transformer element and jumping of the lead terminals are significantly improved.

When an evaluation of the sound pressure level similar to that in Embodiment 1 and Embodiment 2 is conducted with respect to the piezoelectric transformer according to this embodiment, an excellent result is similarly provided. Furthermore, when a transformer sample with a perforated bottom face of the lower case 4B is trially fabricated according to this embodiment, a clearance between the lower lead terminal 40B and the lower case 4B encapsulating the transformer element needs not to be considered whereby the piezoelectric transformer can be thinned further to 45 mm×13 mm×3.3 mm.

The power conversion efficiency is pointed out as an important item of the electric properties and parasitic capacitances must be minimized to achieve a high efficiency. According to this embodiment, a width $w_1$ of each of the base portions 42BL and 42BR of the lead terminals (refer to FIG. 10(a)) is reduced to 0.5 mm and a width $w_2$ (refer to FIG. 10(a)) thereof on the side of the side walls 5BL and 5BR of the cases is reduced to 0.7 mm by which the area of the lead terminal 40B can be reduced by approximately 47% while providing a supporting force similar to that in Embodiment 3. As a result, the parasitic capacitances are reduced by which the piezoelectric transformer having high efficiency can be achieved.

Although an explanation has been given of a case where the upper lead terminal 40A and the lower lead terminal 40B share the same shape according to this embodiment, the upper and lower lead terminals 40A and 40B may respectively have separate shapes so far as the both terminals are supported by the two springs in a face contact. However, as described in Embodiment 3, an equivalent effect is not achieved unless the spring pressure of the lead terminals 40A and 40B is in a range of 20 through 120 gf. Further, the shape of the contact portion 45B of the terminal portion 41B of the lead terminal according to this embodiment may not be flat but may be of a structure of a face of a curvature as is used in Embodiment 2.

According to this embodiment, the lead terminal 40B constitutes a spring having a structure of a beam both ends of which are supported and even if a press force applied on the lead terminal 40B is changed, (particularly, lowered), a constant contact state can be maintained by the piezoelectric transformer element 1 and the lead terminal 40B and therefore, the transformer element 1 can be supported more stably than those in Embodiment 1 and Embodiment 2. Further, durability thereof is excellent since the lead terminal is of the structure of a beam both ends of which are supported. Furthermore, the area in respect of the parasitic capacitances of the lead terminal is smaller than that in Embodiment 3 and further, the structure thereof is simple and therefore, fabrication thereof is easy and design change is easy to deal with.

As has been explained, according to the piezoelectric transformer of the present invention, when the base portion of the lead terminal is bent with the side wall of the case as a fulcrum by receiving a static pressing force from a piezoelectric transformer element at the terminal portion thereof, a rotational angle caused at the terminal portion by bending the base portion is canceled and accordingly, the terminal portion and the input electrode or the output electrode of the piezoelectric transformer element are always kept in parallel with each other.

In this way, according to the present invention, the transformer element and the terminal portion of the lead terminal are always kept in parallel with each other in a state where the piezoelectric transformer element is mounted to the package and the contact between the electrode of the transformer element and the lead terminal does not suffer adverse influence of burrs or deposition of plating at the peripheral edge of the lead terminal by which the smooth contact dispensing with a point contact is achieved. As a result, the contact satisfying the binding conditions of spring in conformity with initial design can be achieved reproducibly and the binding conditions can be maintained for a long period of time whereby the audible noise in operation can be restrained low initially and ageingly. Also, local chipping off of the electrode of the transformer element or the terminal portion of the lead terminal or catching of the lead terminal is improved by which reliability of electric conduction is promoted. Also, instantaneous electric disconnection or generation of noise caused by jumping of the lead terminal is eliminated.

According to the present invention, the canceling of the rotational angle at the contact portion of the lead terminal can be realized by previously inclining the terminal portion of the lead terminal, especially the contact portion thereof in respect of the transformer element. Or, it can be realized by providing a mechanism of causing a rotation by elastic bending with a portion for connecting the terminal portion of the lead terminal and the base portion of the lead terminal as a fulcrum, to the portion.

The present invention provides the piezoelectric transformer having the structure where the piezoelectric transformer element is encapsulated to the package having the lead terminals each composed of a leaf spring and the electrode on the side of the transformer element and the lead terminal are brought into press contact with each other by the elastic spring performance where initial dispersion of the contact state between electrodes on the side of the transformer element and the lead terminal is reduced, the ageing change is also reduced and high reliability of electric conductance is achieved and audible noise is dispensed with.

What is claimed is:

1. A piezoelectric transformer having a structure where a piezoelectric transformer element provided with an input electrode and an output electrode on surfaces of an elongated plate made of a piezoelectric material which is vibrated by applying an alternating current voltage on the elongated plate via the input electrode from outside whereby a voltage generated by the elongated plate is taken out from the output electrode, is encapsulated in a package having a structure where lead terminals each comprising a leaf spring extending on the input electrode or the output electrode in parallel to an electrode forming face of the piezoelectric transformer element, are embedded in side walls of a mold case surrounding the piezoelectric transformer element and the lead terminals are brought into press contact with nodes of vibration of the input electrode or the output electrode provided at the piezoelectric transformer element by an elastic spring performance of the lead terminals;

wherein the lead terminals each comprises at least a terminal portion including a contact portion for bringing the lead terminal in contact with the input electrode or the output electrode of the piezoelectric transformer element, an embedding portion embedded in the side wall of the mold case and a base portion for connecting the terminal portion to the embedding portion;

wherein the terminal portion comprises a connecting portion for connecting to the base portion and the contact portion is a flat contact portion connected to the connecting portion for getting in contact with the input electrode or the output electrode of the piezoelectric transformer in this order in a direction of extending the lead terminal; and wherein when the lead terminal is viewed from a direction orthogonal to the direction of extending the lead terminal and in parallel to the electrode forming face of the piezoelectric transformer element under a state where a static pressing force on the lead terminal from the piezoelectric transformer element is nullified, an inclination is constituted at the contact portion of the terminal portion in respect of the base portion whereby the contact portion is opened in respect of the direction of extending the lead terminal, wherein a curled portion concave to a side of the electrode forming face of the piezoelectric transformer element is provided at a front end of the contact portion in a direction of extending the lead terminal.

2. The piezoelectric transformer according to claim 1, wherein a length of the curled portion of the terminal portion of the lead element is a length of the contact portion or smaller; and wherein a maximum inclination of a face in contact with the curled portion from outside is a maximum inclination of the piezoelectric transformer element or larger.

3. A piezoelectric transformer having a structure where a piezoelectric transformer element provided with an input electrode and an output electrode on surfaces of an elongated plate made of a piezoelectric material which is vibrated by applying an alternating current voltage on the elongated plate via the input electrode from outside whereby a voltage generated by the elongated plate is taken out from the output electrode, is encapsulated in a package having a structure where lead terminals each comprising a leaf spring extending on the input electrode or the output electrode in parallel to an electrode forming face of the piezoelectric transformer element, are embedded in side walls of a mold case surrounding the piezoelectric transformer element and the lead terminals are brought into press contact with nodes of vibration of the input electrode or the output electrode provided at the piezoelectric transformer element by an elastic spring performance of the lead terminals;

wherein the lead terminals each comprises at least a terminal portion including a contact portion for bringing the lead terminal in contact with the input electrode or the output electrode of the piezoelectric transformer element, an embedding portion embedded in the side wall of the mold case and a base portion for connecting the terminal portion to the embedding portion;

wherein the terminal portion comprises a connecting portion for connecting to the base portion and the contact portion is connected to the connecting portion for getting in contact with the input electrode or the output electrode of the piezoelectric transformer in this order in a direction of extending the lead terminal; and wherein when the lead terminal is viewed from a direction orthogonal to the direction of extending the lead terminal and in parallel to the electrode forming face of the piezoelectric transformer element under a state where a static pressing force on the lead terminal from the piezoelectric transformer element is nullified, an inclination is constituted at the contact portion of the terminal portion in respect of the base portion whereby the contact portion is opened in respect of the direction of extending the lead terminal, wherein the contact portion is provided with a face with a curvature concave to a side of the input electrode or the output electrode of the piezoelectric transformer element in a longitudinal direction; and wherein a cut face of the face with a curvature is inclined with respect to the base portion of the lead terminal whereby the cut face is inclined in the direction of extending the base portion.

4. The piezoelectric transformer according to claim 3, wherein a maximum inclination of a face in contact from outside with a portion of the contact portion of the lead terminal constituting the face with a curvature in contact with the input electrode or the output electrode of the piezoelectric transformer, is a maximum inclination of the piezoelectric transformer element or larger.

5. The piezoelectric transformer according to claim 1, wherein an area of contact of the contact portion in respect of the input electrode or the output electrode of the piezoelectric transformer element, is 0.5% or smaller of a projected area of the electrode forming face of the piezoelectric transformer element per unit terminal.

6. The piezoelectric transformer element according to claim 1, wherein at least one of natural frequencies of the lead terminals is deviated from natural frequencies of the piezoelectric transformer element and the natural frequencies of the lead terminals is deviated from a drive frequency of the piezoelectric transformer element by 20 kHz or more.

* * * * *